(12) United States Patent
Chen et al.

(10) Patent No.: US 11,025,195 B2
(45) Date of Patent: Jun. 1, 2021

(54) SWING TRACKING AND CONTROL

(71) Applicant: QUALCOMM Incorporated, San Diego, CA (US)

(72) Inventors: Wu-Hsin Chen, San Diego, CA (US); Rui Xu, San Diego, CA (US); Marco Vigilante, San Diego, CA (US); Li Liu, San Diego, CA (US); Xiaotie Wu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 50 days.

(21) Appl. No.: 16/375,765

(22) Filed: Apr. 4, 2019

(65) Prior Publication Data

US 2020/0321913 A1 Oct. 8, 2020

(51) Int. Cl.
*H03B 5/12* (2006.01)
*H03F 3/195* (2006.01)
(Continued)

(52) U.S. Cl.
CPC ............ *H03B 5/1209* (2013.01); *H03B 5/12* (2013.01); *H03B 5/129* (2013.01); *H03D 7/00* (2013.01); *H03D 7/125* (2013.01); *H03F 3/193* (2013.01); *H03F 3/195* (2013.01); *H03F 3/347* (2013.01); *H03F 3/45183* (2013.01); *H03B 2200/0058* (2013.01); *H03D 2200/0025* (2013.01); *H03D 2200/0033* (2013.01); *H03F 3/45475* (2013.01); *H03F 2200/435* (2013.01); *H03F 2200/451* (2013.01); *H03F 2200/453* (2013.01);
(Continued)

(58) Field of Classification Search
CPC .... H03L 5/00; H03L 3/00; H03B 5/04; H03B 5/1218; H03B 5/1209; H03B 5/129; H03B 5/12; H03B 2200/0058; H03F 3/195; H03F 3/347; H03F 3/193; H03F 3/45183; H03F 2203/45394; H03F 2200/451; H03F 2200/453; H03F 2200/471; H03F 2200/435; H03F 2203/45731; H03F 3/45475; H03D 7/00; H03D 7/125; H03D 2200/0033
USPC .................. 331/183, 185, 167, 175, 117 FE; 455/260, 266
See application file for complete search history.

(56) References Cited

U.S. PATENT DOCUMENTS 5,079,454 A 1/1992 Benton et al.
6,909,336 B1 * 6/2005 Rajagopalan ............. H03L 5/00
331/109

(Continued)

OTHER PUBLICATIONS

Gao Y., et al., "A Broadband Power Detector with Temperature and Process Compensation," 2017 IEEE 12th International Conference on ASIC (ASICON), Guiyang, 2017, pp. 722-725.
(Continued)

*Primary Examiner* — Arnold M Kinkead
(74) *Attorney, Agent, or Firm* — Qualcomm Incorporated

(57) ABSTRACT

In certain aspects, an apparatus includes a transformer including an input inductor and an output inductor, wherein the input inductor is magnetically coupled to the output inductor. The apparatus also includes a transconductance driver configured to drive the input inductor based on an input signal. The apparatus further includes a feedback circuit configured to detect an output voltage swing at the output inductor, generate a regulated voltage at the input inductor, and control the regulated voltage based on the detected output voltage swing.

29 Claims, 21 Drawing Sheets

(51) Int. Cl.
  *H03D 7/00* (2006.01)
  *H03F 3/347* (2006.01)
  *H03F 3/193* (2006.01)
  *H03F 3/45* (2006.01)
  *H03D 7/12* (2006.01)

(52) U.S. Cl.
  CPC ............... *H03F 2200/471* (2013.01); *H03F 2203/45394* (2013.01); *H03F 2203/45731* (2013.01)

(56) References Cited

U.S. PATENT DOCUMENTS

| | | | |
|---|---|---|---|
| 7,482,852 | B1 | 1/2009 | Samavati |
| 2006/0006951 | A1 | 1/2006 | Xu et al. |
| 2014/0113578 | A1 | 4/2014 | Xu et al. |
| 2018/0367171 | A1* | 12/2018 | Jacob .................. H04B 1/04 |

OTHER PUBLICATIONS

Meyer R.G., "Low-Power Monolithic RF Peak Detector Analysis," IEEE Journal of Solid-State Circuits, vol. 30, No. 1, Jan. 1995, pp. 65-67.

Zhang T., et al., "Bipolar Microwave RMS Power Detectors," IEEE Journal of Solid-State Circuits, Sep. 2006, vol. 41, No. 9, pp. 2188-2192.

Zhou Y., et al., "A Low-Power Ultra-Wideband CMOS True RMS Power Detector", IEEE Transactions on Microwave Theory and Techniques, IEEE Service Center, Piscataway, NJ, US, vol. 56, No. 5, May 1, 2008 (May 1, 2008), pp. 1052-1058, XP011207325, ISSN: 0018-9480.

International Search Report and Written Opinion—PCT/US2020/025899—ISA/EPO—dated Jul. 10, 2020.

* cited by examiner

SWING TRACKING AND CONTROL

BACKGROUND

Field

Aspects of the present disclosure relate generally to buffers, and more particularly, to tracking and controlling the output swing of a buffer.

Background

In a wireless communication system (e.g., a millimeter wave (mmWave) system), a local oscillator (LO) network may be used to distribute an LO signal from an LO to mixers in the system. The LO network may include buffers for driving the mixers with the LO signal. The buffers may each include a driver with a transformer as the load to improve power efficiency.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus for buffering an input signal. The apparatus includes a transformer including an input inductor and an output inductor, wherein the input inductor is magnetically coupled to the output inductor. The apparatus also includes a transconductance driver configured to drive the input inductor based on the input signal. The apparatus further includes a feedback circuit configured to detect an output voltage swing at the output inductor, generate a regulated voltage at the input inductor, and control the regulated voltage based on the detected output voltage swing.

A second aspect relates to a method for controlling an output voltage swing of a buffer. The buffer includes a transformer and a driver, the transformer includes an input inductor and an output inductor, the input inductor is driven by the driver, and the input inductor is magnetically coupled to the output inductor. The method includes detecting the output voltage swing at the output inductor, and controlling a regulated voltage at the input inductor based on the detected output voltage swing.

A third aspect relates to an apparatus for buffering an input signal. The apparatus includes a transformer including an input inductor and an output inductor, wherein the input inductor is magnetically coupled to the output inductor. The apparatus also includes a transconductance driver configured to drive the input inductor based on the input signal. The apparatus further includes a feedback circuit configured to detect an output voltage swing at the output inductor, and control a bias current of the driver based on the detected output voltage swing.

A fourth aspect relates to an apparatus for buffering an input signal. The apparatus includes a transformer including an input inductor and an output inductor, wherein the input inductor is magnetically coupled to the output inductor. The apparatus also includes means for driving the input inductor based on the input signal, means for detecting an output voltage swing at the output inductor, means for generating a regulated voltage at the input inductor, and means for controlling the regulated voltage based on the detected output voltage swing.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In a wireless communication system (e.g., a mmWave system), a local oscillator (LO) network may be used to distribute an LO signal from an LO to mixers in the system. The LO network may include buffers for driving the mixers with the LO signal. The buffers may be used to drive the mixers, for example, when the LO lacks the drive capability to directly drive the mixers. In addition, the buffers may provide the LO with high isolation from loads (e.g., mixer loads) in the LO network to prevent the loads from degrading the performance of the LO. For example, the buffers may provide the LO with high isolation from load changes in the LO network to prevent the load changes from causing a large shift in the oscillator frequency of the LO, which can degrade the LO signal.

Figure 1A:
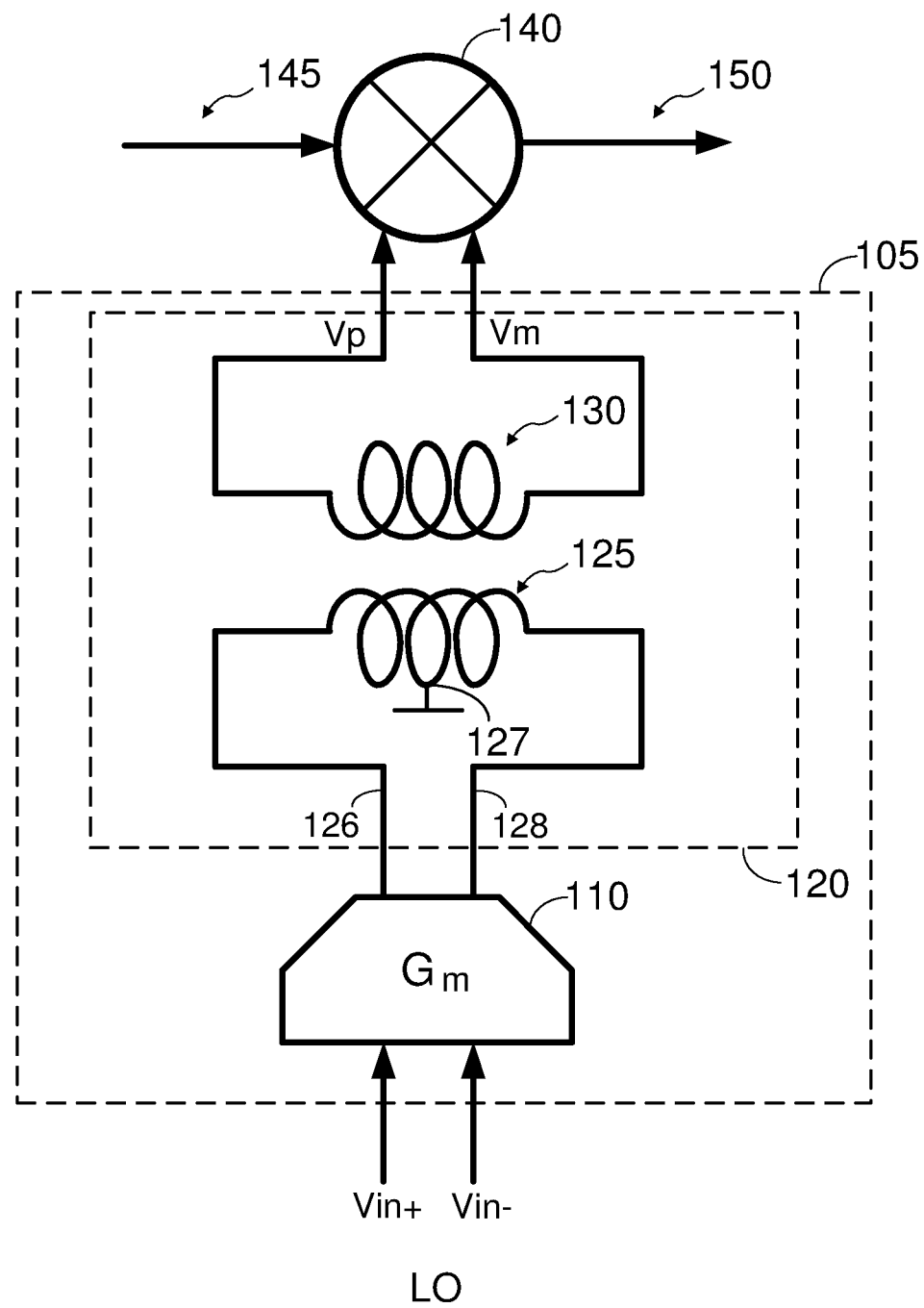
FIG. 1A shows an example of a buffer including a transconductance driver and a transformer according to certain aspects of the present disclosure.

FIG. 1A shows an example of a buffer 105 according to certain aspects of the present disclosure. The buffer 105 includes a transconductance driver 110 and a transformer 120, in which the transformer 120 is used as the load for the transconductance driver 110 to increase output impedance and improve power efficiency. The transformer 120 includes an input inductor 125 and an output inductor 130, in which the input inductor 125 is magnetically coupled to the output inductor 130.

The transconductance driver 110 drives the input inductor 125 based on an input signal. In one example, the input signal is a differential input voltage (Vin+ and Vin−). In this example, the transconductance driver 110 converts the differential input voltage (Vin+ and Vin−) into a drive current to drive the input inductor 125. The drive current is converted into a differential output voltage (Vp and Vm) at the output inductor 130, which is output to another device (e.g., mixer). In the example in FIG. 1A, a center tap 127 of the input inductor 125 is coupled to a voltage supply rail.

Figure 1B:
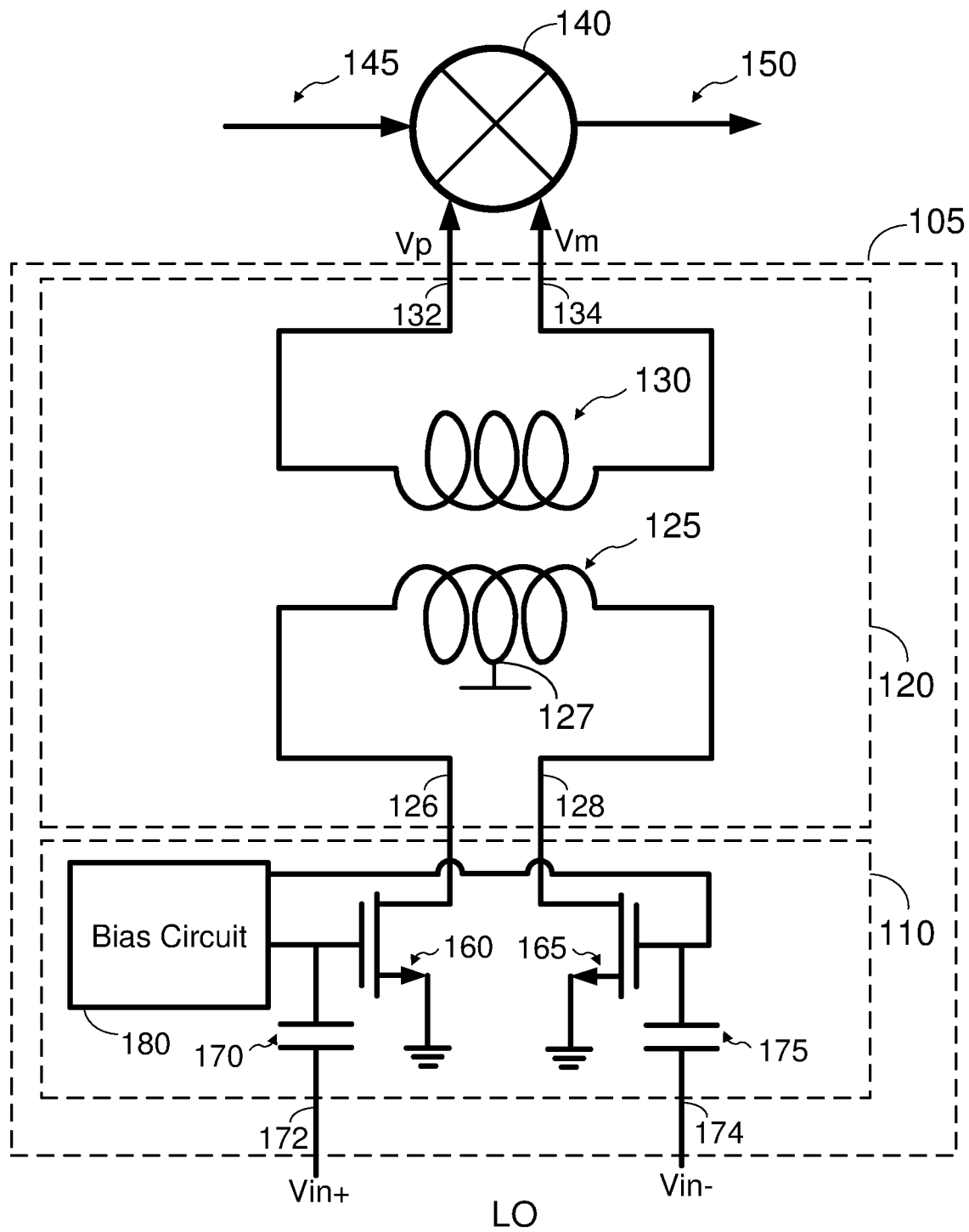
FIG. 1B shows an exemplary implementation of a transconductance driver according to certain aspects of the present disclosure.

FIG. 1B shows an exemplary implementation of the transconductance driver 110 according to certain aspects of the present disclosure. In this example, the transconductance driver 110 has a differential input configured to receive the differential input voltage (Vin+ and Vin−). The differential input includes a first input 172 and a second input 174, in which the first input 172 receives voltage Vin+ and the second input 174 receives voltage Vin−. In this example, the transconductance driver 110 includes a first transistor 160 and a second transistor 165 forming a differential pair. The first and second transistors 160 and 165 may be implemented with n-type field effect transistors (NFETs), although it may be possible in certain implementations to use other transistor types. In this example, the drain of the first transistor 160 is coupled to a first end 126 of the input inductor 125, the source of the first transistor 160 is coupled to ground, and the gate of the first transistor 160 is coupled to the first input 172 via a first coupling capacitor 170. The drain of the second transistor 165 is coupled to a second end 128 of the input inductor 125, the source of the second transistor 165 is coupled to ground, and the gate of the second transistor 165 is coupled to the second input 174 via a second coupling capacitor 175. The input inductor 125 is coupled between the drains of the first and second transistor 160 and 165.

In operation, the first and second transistors 160 and 165 convert the differential input voltage into a drive current that drives the input inductor 125. The transconductance driver 110 also includes a bias circuit 180 coupled to the gates of the first and second transistors 160 and 165. The bias circuit 180 is configured to bias the gates of the first and second transistors 160 and 165 with a gate bias voltage.

In this example, the input of the buffer 105 corresponds to the differential input 172 and 174 of the transconductance driver 110 and the output of the buffer 105 corresponds to the two ends 132 and 134 of the output inductor 130. The buffer 105 may be used to provide high isolation (e.g., 20 dB or higher) between the input and the output of the buffer 105. In one example, the buffer 105 may be used to provide high isolation between an LO coupled to the input of the buffer 105 and a mixer coupled to the output of the buffer 105.

In certain aspects, the buffer 105 is used as a buffer in a local oscillator (LO) path that provides an LO signal from an LO (not shown) to a mixer 140. In these aspects, the buffer 105 drives the mixer 140 with the LO signal (e.g., a sinusoidal signal). As shown in FIGS. 1A and 1B, the LO signal is a differential voltage Vin+ and Vin− at the input of the buffer 105 and a differential voltage Vp and Vm at the output of the buffer 105. The mixer 140 is configured to mix the LO signal with an input signal 145 to frequency shift the input signal 145. For example, the mixer 140 may be used in a receiver to frequency downconvert a radio frequency (RF) input signal 145 into an intermediate-frequency output signal 150. In another example, the mixer 140 may be used in a transmitter to frequency upconvert an intermediate-frequency input signal 145 into an RF output signal 150. In the example shown in FIGS. 1A and 1B, the LO signal is differential. The input signal 145 and the output signal 150 may also be differential.

The buffer 105 is capable of operating at very-high frequencies (e.g., tens of gigahertz) in the millimeter wave (mmWave) band. This makes the buffer 105 suitable for mmWave systems, which are used, for example, in fifth generation (5G) wireless communications. However, a challenge with using the buffer 105 is that the output voltage swing of the buffer 105 can vary (e.g., by more than 6 dB) across process-voltage-temperate (PVT) corners. This is because the output voltage swing is current limited, not voltage limited. The negative impact of the output voltage swing variation may include one or more of the following: excess power consumption, signal path gain variation, increased LO leakage, and reliability issues.

With regard to excess power consumption, the mixer 140 may require a minimum LO swing to drive the mixer 140. To ensure that the minimum LO swing requirement is met across PVT corners, a bias current of the transconductance driver 110 may be set so that the output voltage swing of the buffer 105 meets the minimum LO swing requirement for the worst-case PVT corner. However, this approach may cause the output voltage swing to be significantly higher than the minimum LO swing requirement for some PVT corners. Consequently, for these PVT corners, the LO swing may be significantly higher than needed to drive the mixer 140, resulting in large excess power consumption for these PVT corners.

With regard to signal path gain variation, the signal path gain may vary with the LO swing at the mixer 140. As a result, variation in the output voltage swing of the buffer 105 across PVT corners may lead to variation in the signal path gain across PVT corners. In this case, signal path gain calibration may have a difficult time calibrating the signal path gain for variation in the LO swing across temperature.

With regard to LO leakage, a portion of the LO signal at the mixer 140 leaks into the output of the mixer 140. The output voltage swing (and hence LO swing at the mixer 140) may significantly increase (e.g., by 6 dB) for some PVT corners, which worsens LO leakage.

With regard to reliability, the large output voltage swing (and hence large LO swing at the mixer 140) for some PVT corners can cause devices to fail (e.g., by exceeding tolerances for these devices). This may force a designer to avoid using the most effective approach in terms of performance if a less effective approach has a higher tolerance of large LO swing.

To reduce the swing variation discussed above, aspects of the present disclosure track and control the output voltage swing of the buffer 105. In some implementations, a feedback circuit detects the output voltage swing of the buffer 105 (e.g., using a peak detector), and adjusts the output voltage swing based on the detected output voltage swing to keep the output voltage swing close to a target voltage swing (i.e., approximately equal to the target voltage swing). To keep the output voltage swing close to the target voltage swing, the feedback circuit may decrease the output voltage swing when the detected output voltage swing is above the target voltage swing to move the output voltage swing closer to the target voltage swing, and increase the output voltage swing when the detected output voltage swing is below the target voltage swing to move the output voltage swing closer to the target voltage swing. The feedback circuit may adjust the output voltage swing of the buffer 105 by adjusting a parameter of the buffer 105 affecting the output voltage swing. The parameter may include a voltage at the input inductor 125 and/or a bias current of the transconductance driver 110, as discussed further below.

Figure 2:
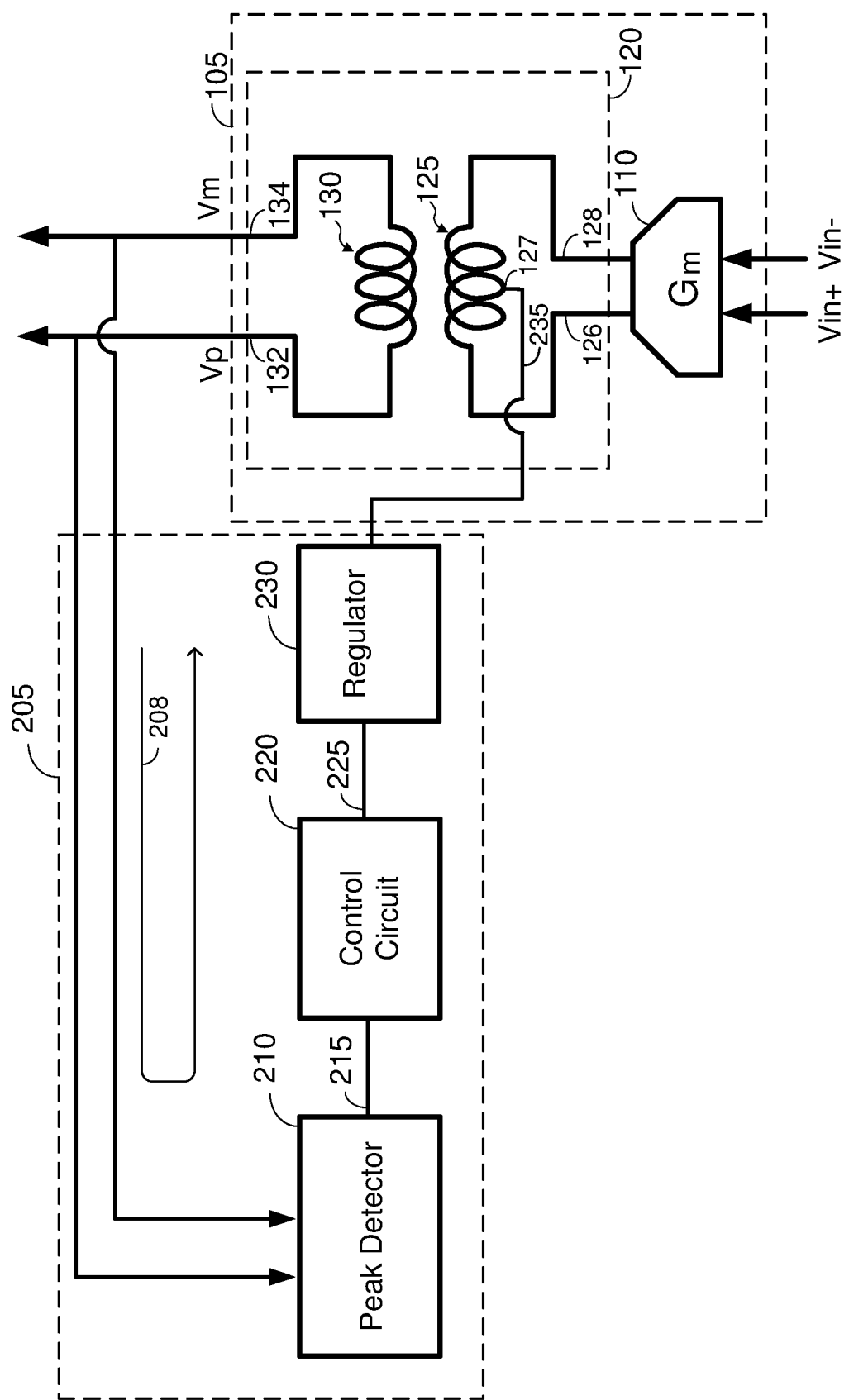
FIG. 2 shows an example of a feedback circuit for tracking and controlling the output voltage swing of a buffer according to certain aspects of the present disclosure.

FIG. 2 shows an example of a feedback circuit 205 for tracking and controlling the output voltage swing of the buffer 105 according to certain aspects of the present disclosure. In this example, the feedback circuit 205 controls the output voltage swing by controlling a regulated voltage 235 at the input inductor 125 (e.g., center tap 127 of the input inductor 125). The output voltage swing at the differential output of the buffer 105 is approximately a linear function of the regulated voltage 235, in which the output voltage swing increases when the regulated voltage 235 is increased and decreases when the regulated voltage 235 is decreased. Thus, the feedback circuit 205 is able to control the output voltage swing of the buffer 105 by controlling the regulated voltage 235.

In certain aspects, the feedback circuit 205 is configured to detect the output voltage swing at the output inductor 130, generate the regulated voltage 235 at the input inductor 125 (e.g., center tap 127 of the input inductor 125), and control the regulated voltage 235 based on the detected output voltage swing. In these aspects, the feedback circuit 205 may control the regulated voltage 235 based on the detected output voltage swing by comparing the detected output voltage swing with a target voltage swing, and adjusting the regulated voltage 235 in a direction that reduces the difference between the output voltage swing and the target voltage swing. For example, if the detected output voltage swing is above the target voltage swing, then the feedback circuit 205 may decrease the regulated voltage 235 to decrease the output voltage swing. If the detected output voltage swing is below the target voltage swing, then the feedback circuit 205 may increase the regulated voltage 235 to increase the output voltage swing. In this way, the feedback circuit 205 adjusts the regulated voltage 235 based the detected output voltage swing to keep the output voltage swing of the buffer 105 close to the target voltage swing.

In the example shown in the FIG. 2, the feedback circuit 205 includes a peak detector 210, a control circuit 220, and a voltage regulator 230 coupled in a feedback loop 208. The peak detector 210 is configured to detect the output voltage swing, the voltage regulator 230 is configured to generate the regulated voltage 235, and the control circuit 220 is configured to control the regulated voltage 235 generated by the voltage regulator 230 based on the detected output voltage swing, as discussed further below.

The peak detector 210 has a differential input coupled to the differential output of the buffer 105. The peak detector 210 is configured to detect the output voltage swing at the differential output of the buffer 105, and generate a swing detection signal 215 based on the detected output voltage swing. The output voltage swing may be approximately equal to the peak difference between the voltage Vp at the positive output the buffer 105 and the voltage Vm at the minus output of the buffer 105. In certain aspects, the swing detection signal 215 may be a voltage that is related (e.g., proportional) to the output voltage swing of the buffer 105, as discussed further below.

The control circuit 220 is configured to receive the swing detection signal 215 from the peak detector 210, and generate a control signal 225 based on the swing detection signal 215. The control signal 225 is input to the voltage regulator 230 to control the regulated voltage 235 generated by the voltage regulator 230.

The voltage regulator 230 is coupled to the input inductor 125. In certain aspects, the voltage regulator 230 is coupled to the center tap 127 of the input inductor 125 (although there may be possible implementations where other tap points may be used). The voltage regulator 230 is configured to generate the regulated voltage 235 from the supply voltage, and apply the regulated voltage 235 to the the input inductor 125 (e.g., at the center tap 127). The regulated voltage 235 generated by the voltage regulator 230 is controlled by the control signal 225 from the control circuit 220.

In certain aspects, the control circuit 220 generates the control signal 225 by comparing the swing detection signal 215 with a target reference signal corresponding to the target voltage swing, and generating the control signal 225 based on the comparison. In these aspects, the target reference signal provides a reference point with which the swing detection signal 215 is compared to assess whether the output voltage swing is above or below the target voltage swing. In one example, the output voltage swing is approximately equal to the target voltage swing when the swing detection signal 215 is approximately equal to the reference target signal. In this example, the reference target signal indicates the value (e.g., voltage) that the swing detection signal 215 should have when the output voltage swing is equal to the target voltage swing. If the swing detection signal 215 is above the reference target signal, then the output voltage swing is above the target voltage swing, and, if the swing detection signal 215 is below the reference target signal, then the output voltage swing is below the target voltage swing. In this example, the control circuit 220 keeps the output voltage swing close to the target voltage swing by adjusting the regulated voltage 235 in a direction that reduces the difference between the swing detection signal 215 and the target reference signal.

Thus, the feedback circuit 205 adjusts the regulated voltage 235 based on feedback of the output voltage swing to keep the output voltage swing of the buffer 105 close to the target voltage swing. The feedback circuit 205 is able to keep the output voltage swing close to the target voltage swing across PVT corners, thereby significantly reducing variation in the output voltage swing across PVT corners compared with systems that do not use feedback to control the output voltage swing. The reduced variation in the output voltage swing across PVT corners mitigates the excess power consumption, signal path gain variation, increased LO leakage, and/or reliability issues discussed above with reference to FIGS. 1A and 1B.

For the example in which the buffer 105 is used in an LO path that provides an LO signal from an LO to the mixer 140, the target voltage swing may be set close to a minimum LO swing requirement for driving the mixer 140 (e.g., to minimize power consumption). In this example, the feedback circuit 205 keeps the output voltage swing of the buffer 105 close to the minimum LO swing across PVT corners. This helps prevent the output voltage swing from being significantly higher than the minimum LO swing for some PVT corners, which can lead to the excess power consumption, increased LO leakage and/or reliability issues discussed above.

The LO path from the LO to the mixer 140 may include one or more other devices in addition to the buffer 105. The one or more other devices may include an amplifier, another buffer, a phase shifter and/or a vector modulator. In this example, the buffer 105 may be placed at the end of the LO path (also referred to as an LO chain) right before the mixer 140. Placing the buffer 105 at the end of the LO path allows the feedback circuit 205 to control the LO swing at the mixer 140. By controlling the LO swing at the end of the LO path, the feedback circuit 205 is able to clean up swing variation caused by one or more others devices in the LO path preceding the buffer 105. This is because the feedback circuit 205 keeps the output voltage swing of the buffer 105 close to the target voltage swing, which helps prevent swing variation caused by the one or more preceding devices in the LO path from propagating to the mixer 140. In this example, the swing variation from the one or more preceding devices in the LO path may include amplitude modulation (AM) noise, swing variation due to PVT variations in the one or more preceding devices, and/or non-idealities in the one or more preceding devices.

The feedback circuit 205 adjusts the regulated voltage 235 at the input inductor 125 based on feedback of the output voltage swing to keep the output voltage swing of the buffer 105 close to the target voltage swing. Thus, in this example, the regulated voltage 235 at the input inductor 125 is the parameter of the buffer 105 that is adjusted to control the output voltage swing. As discussed above, the output voltage swing of the buffer 105 is approximately a linear function of the regulated voltage 235 at the input inductor 125. The approximately linear relationship between the regulated voltage 235 and the output voltage swing helps provide good loop stability for the feedback loop 208.

Figure 3:
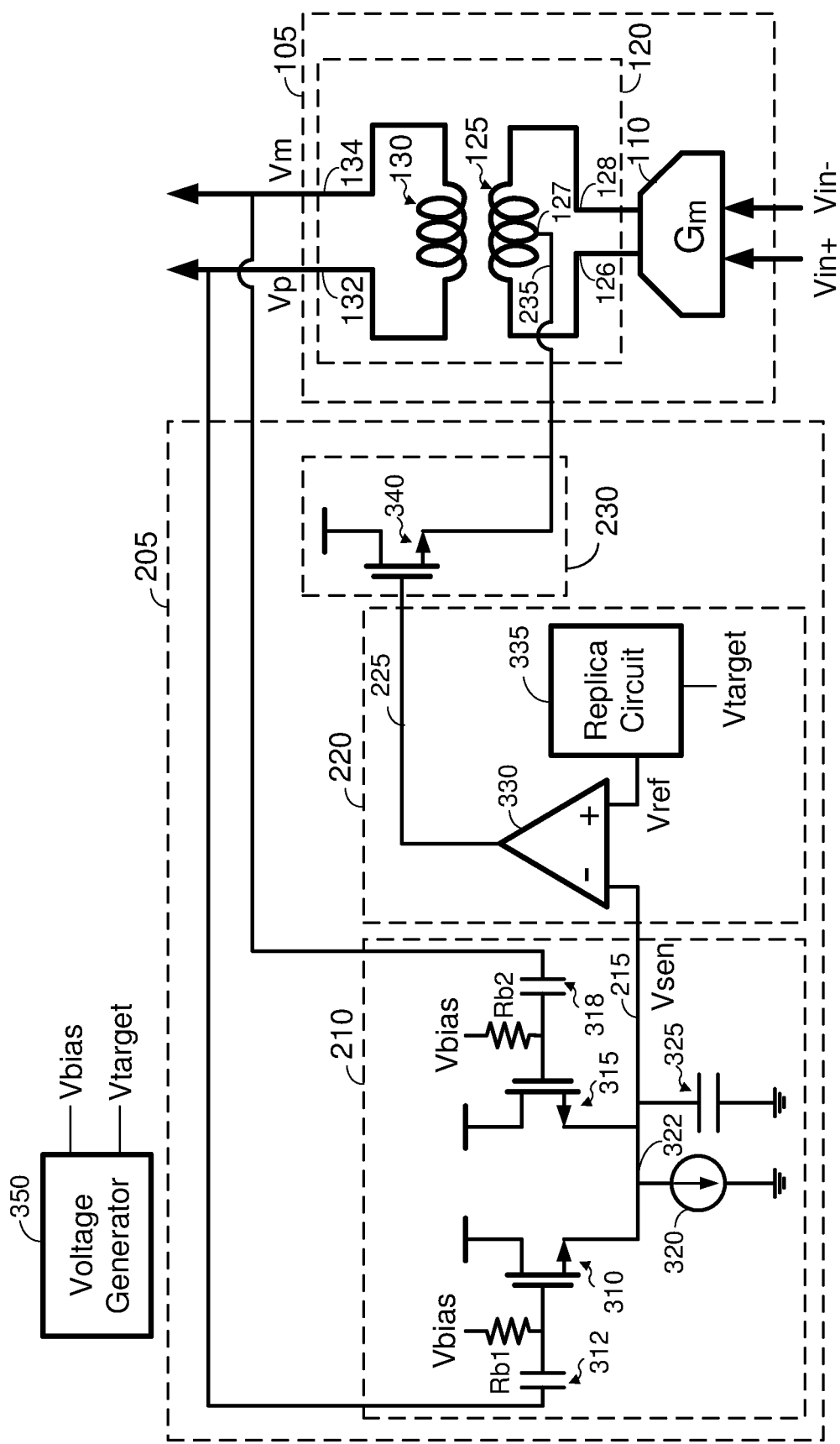
FIG. 3 shows exemplary implementations of a peak detector, a control circuit and a voltage regulator according to certain aspects of the present disclosure.

FIG. 3 shows exemplary implementations of the peak detector 210, the control circuit 220 and the voltage regulator 230 according to certain aspects of the present disclosure. In the example in FIG. 3, the peak detector 210 includes a first transistor 310, a second transistor 315, a current source 320 and a hold capacitor 325. The first and second transistors 310 and 315 may be implemented with n-type field effect transistors (NFETs), although p-type or other types of transistors may be possible in certain implementations. In this example, the drain of the first transistor 310 is coupled to the voltage supply rail, the source of the first transistor 310 is coupled to node 322, and the gate of the first transistor 310 coupled to the positive output of the buffer 105 through a first coupling capacitor 312. The gate of the first transistor 310 is DC biased by a bias voltage (labeled "Vbias") through a first bias resistor (labeled "Rb1"). The drain of the second transistor 315 is coupled to the voltage supply rail, the source of the second transistor 315 is coupled to node 322, and the gate of the second transistor 315 is coupled to the minus output of the buffer 105 through a second coupling capacitor 318. The gate of the second transistor 315 is DC biased by the bias voltage Vbias through a second bias resistor (labeled "Rb2"). The current source 320 is coupled between node 322 and ground, and the hold capacitor 325 is coupled between node 322 and ground.

The first and second transistors 310 and 315 are configured as source followers, in which the positive output Vp of the buffer 105 is input to the gate of the first transistor 310, the minus output Vm of the buffer 105 is input to the gate of second transistor 315, and the output of the peak detector 210 is coupled to the sources of the first and second transistors 310 and 315 at node 322. In this configuration, the first and second transistors 310 and 315 function as rectifiers that, in combination with the hold capacitor 325, produce a sense voltage (labeled "Vsen") at node 322 that is related (e.g., proportional) to the output voltage swing of the buffer 105. The hold capacitor 325 holds the sense voltage Vsen at the output of the peak detector 210. In one example, the sense voltage Vsen and the output voltage swing are related by a ratio that is a function of the bias voltage Vbias. In this example, the sense voltage Vsen is higher for a higher output voltage swing and lower for a lower output voltage swing within an output voltage swing range. Thus, the sense voltage Vsen tracks changes in the output voltage swing. The sense voltage Vsen varies slowly relative to the frequency of the LO signal, and thus may be considered approximately a DC voltage with respect to the LO signal. In this example, the sense voltage Vsen corresponds to the swing detection signal 215 discussed above, and is generated based on the bias voltage Vbias and the output voltage swing of the buffer 105.

The current source 320 provides bias current for the first and second transistors 310 and 315. The current source 320 also helps the peak detector 210 track changes in the output voltage swing of the buffer 105. For example, if the output voltage swing decreases, the current source 320 discharges some of the charge on the hold capacitor 325 to allow the sense voltage Vsen to decrease to reflect the decrease in the output voltage swing.

In the example in FIG. 3, the control circuit 220 includes an operational amplifier 330, and a replica circuit 335. The replica circuit 335 may have the same structure or substantially the same structure as the peak detector 210. As discussed further below, the replica circuit 335 is used to set the target voltage swing of the feedback circuit 205, and cancel out variation in the sense voltage Vsen due to PVT conditions in the peak detector 210.

Figure 4:
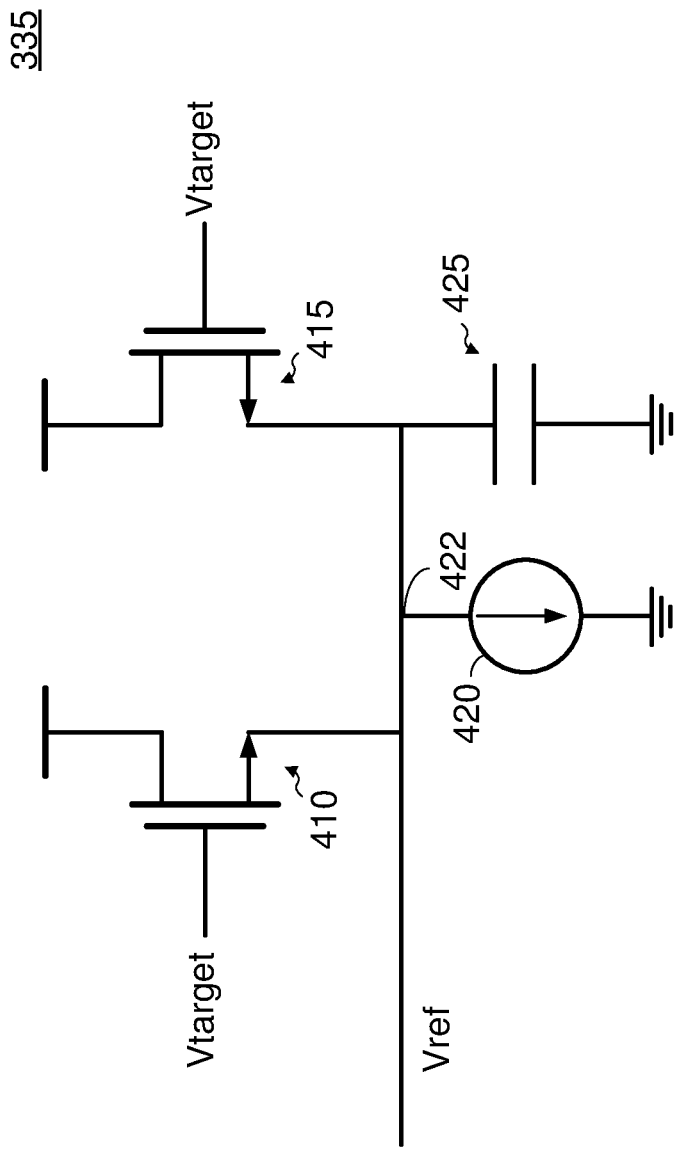
FIG. 4 shows an exemplary implementation of a replica circuit according to certain aspects of the present disclosure.

FIG. 4 shows an exemplary implementation of the replica circuit 335 according to certain aspects. In this example, the replica circuit 335 includes a first transistor 410, a second transistor 415, a current source 420 and a hold capacitor 425. The drain of the first transistor 410 is coupled to the voltage supply rail, the source of the first transistor 410 is coupled to node 422, and the gate of the first transistor 410 is biased by a target voltage (labeled "Vtarget"). The drain of the second transistor 415 is coupled to the voltage supply rail, the source of the second transistor 415 is coupled to node 422, and the gate of the second transistor 415 is biased by the target voltage Vtarget. The current source 420 is coupled between node 422 and ground, and the hold capacitor 425 is coupled between node 422 and ground.

The replica circuit 335 is structurally similar to the peak detector 210 in which the first transistor 410, the second transistor 415, the current source 420 and the hold capacitor 425 of the replica circuit 335 correspond to the first transistor 310, the second transistor 315, the current source 320 and the hold capacitor 325 of the peak detector 210, respectively. Unlike the peak detector 210, the gates of the first and second transistors 410 and 415 of the replica circuit 335 are not coupled to the differential output of the buffer 105. The gates of the first and second transistors 410 and 415 are biased by the target voltage Vtarget, which is used to set the target voltage swing, as discussed further below. The replica circuit 335 generates a DC reference voltage Vref at node 422 based on the target voltage Vtarget. In this example, the reference voltage Vref corresponds to the target reference signal discussed above.

Referring back to FIG. 3, the sense voltage Vsen is input to the minus input of the amplifier 330, and the reference voltage Vref is input to the positive input of the amplifier 330. The output of the amplifier 330 provides the control signal 225 to the voltage regulator 230.

In operation, the amplifier 330 adjusts the control signal 225 in a direction that reduces the difference between the sense voltage Vsen and the reference voltage Vref input to the amplifier 330. For example, if the sense voltage Vsen is below the reference voltage Vref, then the amplifier 330 adjusts the control signal 225 in a direction that causes the voltage regulator 230 to increase the regulated voltage 235. The increase in the regulated voltage 235 increases the output voltage swing of the buffer 105, which, in turn, increases the sense voltage Vsen. If the sense voltage Vsen is above the reference voltage Vref, then the amplifier 330 adjusts the control signal 225 in a direction that causes the voltage regulator 230 to decrease the regulated voltage 235. The decrease in the regulated voltage 235 decreases the output voltage swing of the buffer 105, which, in turn, decreases the sense voltage Vsen.

Thus, the amplifier 330 forces the sense voltage Vsen to be approximately equal to the reference voltage Vref (i.e., approximately balances Vsen and Vref). This occurs when the output voltage swing of the buffer 105 is approximately equal to the target voltage Vtarget minus the bias voltage Vbias (i.e., Vtarget−Vbias). As a result, the feedback circuit 205 adjusts the regulated voltage 235 such that the output voltage swing of the buffer 105 is approximately equal to Vtarget−Vbias. Thus, in this example, the target voltage swing of the feedback circuit 205 is approximately equal to Vtarget−Vbias.

Therefore, the target voltage swing may be set by setting the bias voltages of the peak detector 210 and the replica circuit 335 (i.e., Vbias and Vtarget) according to the desired target voltage swing. For example, for a given bias voltage Vbias, the target voltage swing may be set by setting the target voltage Vtarget at the replica circuit 335 such that Vtarget−Vbias equals the desired target voltage swing. In this regard, the bias voltage Vbias and the target voltage Vtarget may be generated by a voltage generator 350. The voltage generator 350 may be configured to set the voltage levels of the bias voltage Vbias and the target voltage Vtarget such that Vtarget−Vbias equals the desired target voltage swing.

As discussed above, the replica circuit 335 is also used to cancel out variation in the sense voltage Vsen due to PVT conditions in the peak detector 210. In this regard, the replica circuit 335 may be integrated on the same chip (i.e., die) as the peak detector 210. In certain aspects, the replica circuit 335 may be located in close proximity to the peak detector 210 so that the replica circuit 335 is subjected to approximately the same PVT conditions as the peak detector 210. As a result, the variation in the reference voltage Vref due to PVT conditions is approximately the same as the variation in the sense voltage Vsen due to PVT conditions. Since the amplifier 330 takes the difference of the sense voltage Vsen and the reference voltage Vref at its inputs, the variation in the reference voltage Vref due to PVT conditions approximately cancels out the variation in the sense voltage Vsen due to PVT conditions. This reduces the PVT effect on the control signal 225, resulting in more accurate control of the output voltage swing.

In the example in FIG. 3, the voltage regulator 230 is implemented with a transistor 340 (e.g., NFET) having a drain coupled to the voltage supply rail, a source coupled to the input inductor 125 (e.g., at the center tap 127), and a gate coupled to the control signal 225. In this example, the transistor 340 provides current from the voltage supply rail to the input inductor 125. The regulated voltage 235 is approximately equal to the voltage at the supply rail minus the voltage drop across the transistor 340. In this example, the control circuit 220 controls the regulated voltage 235 by controlling the channel conductance of the transistor 340, which, in turn, controls the voltage drop across the transistor 340. For example, to increase the regulated voltage 235, the control circuit 220 increases the channel conductance of the transistor 340 (i.e., decreases the resistance of the transistor 340). The increased channel conductance reduces the voltage drop across the transistor 340, thereby raising the regulated voltage 235. To decrease the regulated voltage 235, the control circuit 220 decreases the channel conductance of the transistor 340 (i.e., increases the resistance of the transistor 340). The decreased channel conductance increases the voltage drop across the transistor 340, thereby lowering the regulated voltage 235.

For the example in which the transistor 340 is implemented with an NFET (shown in the example in FIG. 3), the control circuit 220 increases the channel conductance of the transistor 340 by increasing the voltage level of the control signal 225 and decreases the channel conductance of the transistor 340 by decreasing the voltage level of the control signal 225. For the exemplary implementation of the control circuit 220 shown in FIG. 3, the control signal 225 is provided by the output of the operational amplifier 330.

Figure 5:
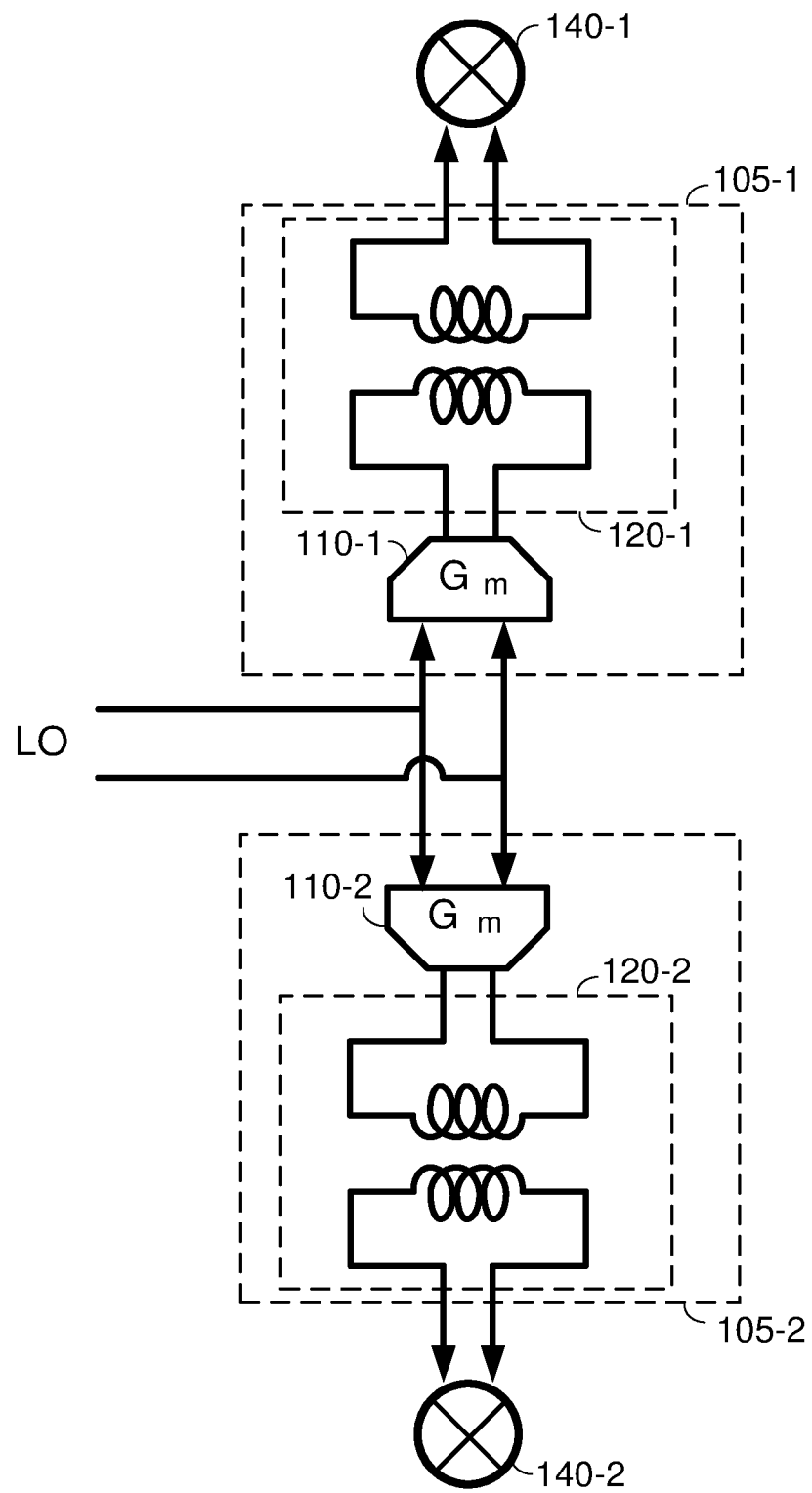
FIG. 5 shows an example of a local oscillator (LO) network for distributing an LO signal to multiple mixers according to certain aspects of the present disclosure.

As discussed above, the buffer 105 may be used in an LO path that provides an LO signal to a mixer 140. In certain aspects, multiple instances (i.e., copies) of the buffer 105 may be used in an LO network that distributes an LO signal to multiple mixers. In this regard, FIG. 5 shows an example of an LO network that distributes an LO signal from an LO (not shown) to a first mixer 140-1 and a second mixer 140-2. Although two mixers are shown in the example in FIG. 5, it is to be appreciated that the LO network may distribute the LO signal to more than two mixers. In this example, the LO network includes a first buffer 105-1 configured to buffer the LO signal for the first mixer 140-1 and a second buffer 105-2 configured to buffer the LO signal for the second mixer 140-2. Each of the buffers 105-1 and 105-2 is a separate instance of the buffer 105 shown in FIG. 3, and includes a respective transconductance driver 110-1 and 110-2 and a respective transformer 120-1 and 120-2.

In an example, the first mixer 140-1 is used in a transmitter to frequency upconvert an intermediate-frequency signal into an RF signal for transmission, and the second mixer 140-2 is used in a receiver to frequency downconvert a received RF signal into an intermediate-frequency signal. In this example, the receiver and transmitter may be part of a transceiver that switches between transmitting and receiving (e.g., half duplex), but does not transmit and receive simultaneously. Thus, in this example, only one of the first and second mixer 140-1 and 140-2 is used at a given time.

Figure 6A:
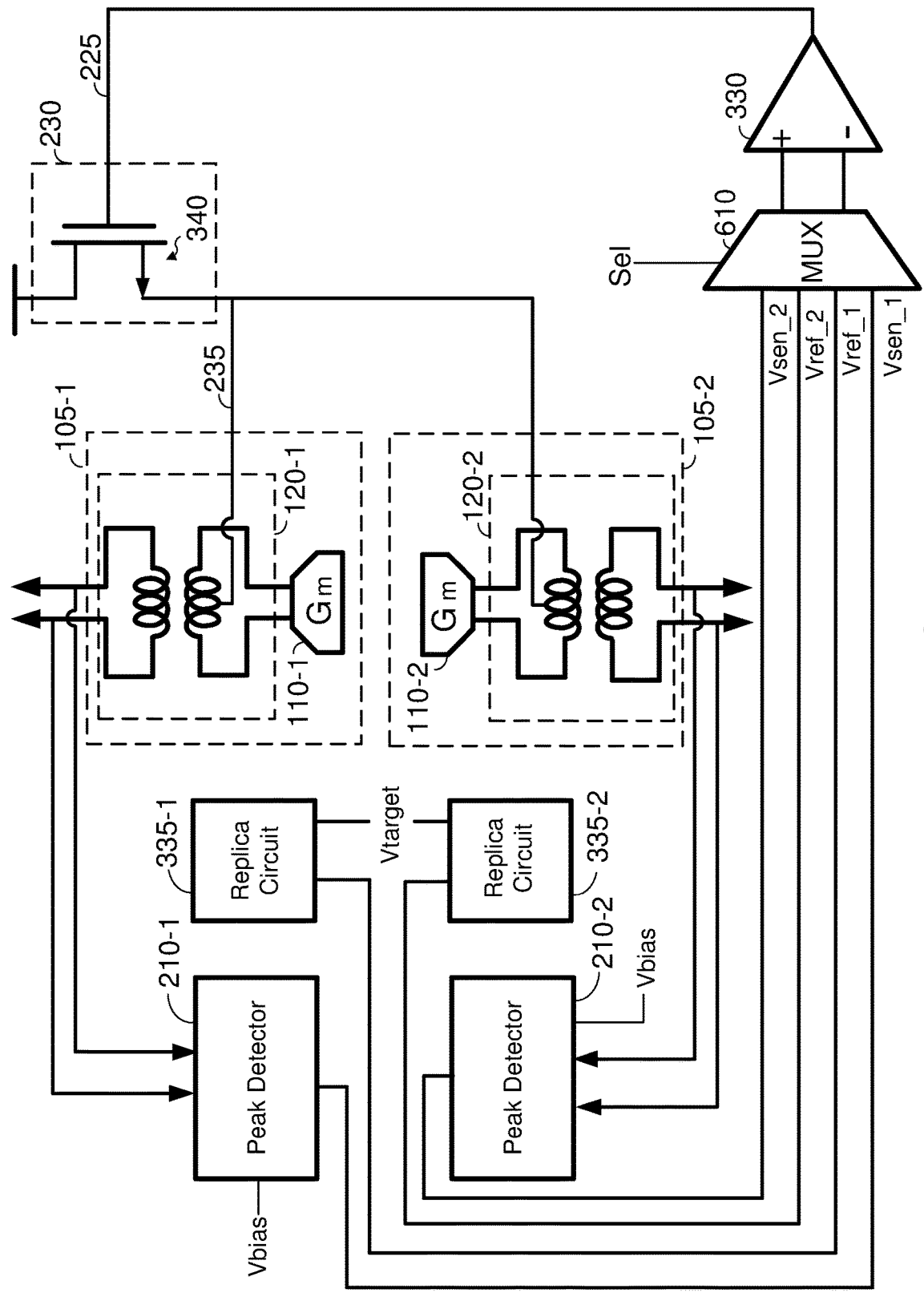
FIG. 6A shows an example of a feedback circuit capable of switching between multiple buffers according to certain aspects of the present disclosure.

FIG. 6A shows an example of a feedback circuit for tracking and controlling the output voltage swings of the first and second buffers 105-1 and 105-2 one at a time. In this example, the feedback circuit includes first and second peak detectors 210-1 and 210-2, first and second replica circuits 335-1 and 335-2, a multiplexer 610, an operational amplifier 330, and a voltage regulator 230. In this example, the operational amplifier 330 and the regulator 230 are common to the first and second buffers 105-1 and 105-2. The feedback circuit is able to use the same operational amplifier 330 and regulator 230 for the first and second buffers 105-1 and 105-2 since only one of the first and second mixers 140-1 and 140-2 is used at a time. The first and second peak detectors 210-1 and 210-2 may each be implemented using the exemplary peak detector 210 shown in FIG. 3, and the first and second replica circuits 335-1 and 335-2 may each be implemented using the exemplary replica circuit 335 shown in FIG. 4.

The first peak detector 210-1 is configured to detect the output voltage swing of the first buffer 105-1, and generate a first sense voltage (labeled "Vsen_1") based on the detected output voltage swing. The first replica circuit 335-1 is configured to generate a first reference voltage (labeled "Vref_1") based on the target voltage. The second peak detector 210-2 is configured to detect the output voltage swing of the second buffer 105-2, and generate a second sense voltage (labeled "Vsen_2") based on the detected output voltage swing. The second replica circuit 335-2 is configured to generate a second reference voltage (labeled "Vref_2") based on the target voltage.

The first and second sense voltages Vsen_1 and Vsen_2 and the first and second references voltages Vref_1 and Vref_2 are input to the multiplexer 610. The multiplexer 610 selects one of the sense voltages and one of the reference voltages depending on which one of the mixers 140-1 and 140-2 is being used at a given time. For example, if the first mixer 140-1 is currently being used, then the multiplexer 610 selects the first sense voltage Vsen_1 and the first reference voltage Vref_1. The multiplexer 610 couples the selected sense voltage to the minus input of the amplifier 330, and couples the selected reference voltage to the positive input of the amplifier 330. In this regard, the multiplexer 610 may receive a select signal (labeled "Sel") indicating one of the sense voltages and one of the reference voltages, and select the sense voltage and the reference voltage indicated by the select signal Sel.

The operational amplifier 330 generates a control signal 225 based on a comparison of the selected sense voltage and reference voltage, and outputs the control signal 225 to the regulator 230. The control signal 225 controls a regulated voltage 235 generated by the regulator 230, in which the regulated voltage 235 is provided to the input inductor of the first buffer 105-1 (e.g., at the center tap of the input inductor of the first buffer 105-1) and the input inductor of the second buffer 105-2 (e.g., at the center tap of the input inductor of the second buffer 105-2).

In operation, the feedback circuit adjusts the regulated voltage 235 based on feedback of the output voltage swing of the buffer 105-1 or 105-2 corresponding to the mixer 140-1 or 140-2 that is currently being used such that the output voltage swing is approximately equal to the target voltage swing. In the example in FIG. 6A, each of the peak detectors 210-1 and 210-2 is biased by the bias voltage Vbias, each of the replica circuits 335-1 to 335-2 is biased by the target voltage Vtarget, and the target voltage swing is approximately equal to the target voltage Vtarget minus the bias voltage Vbias (i.e., Vtarget−Vbias).

Figure 6B:
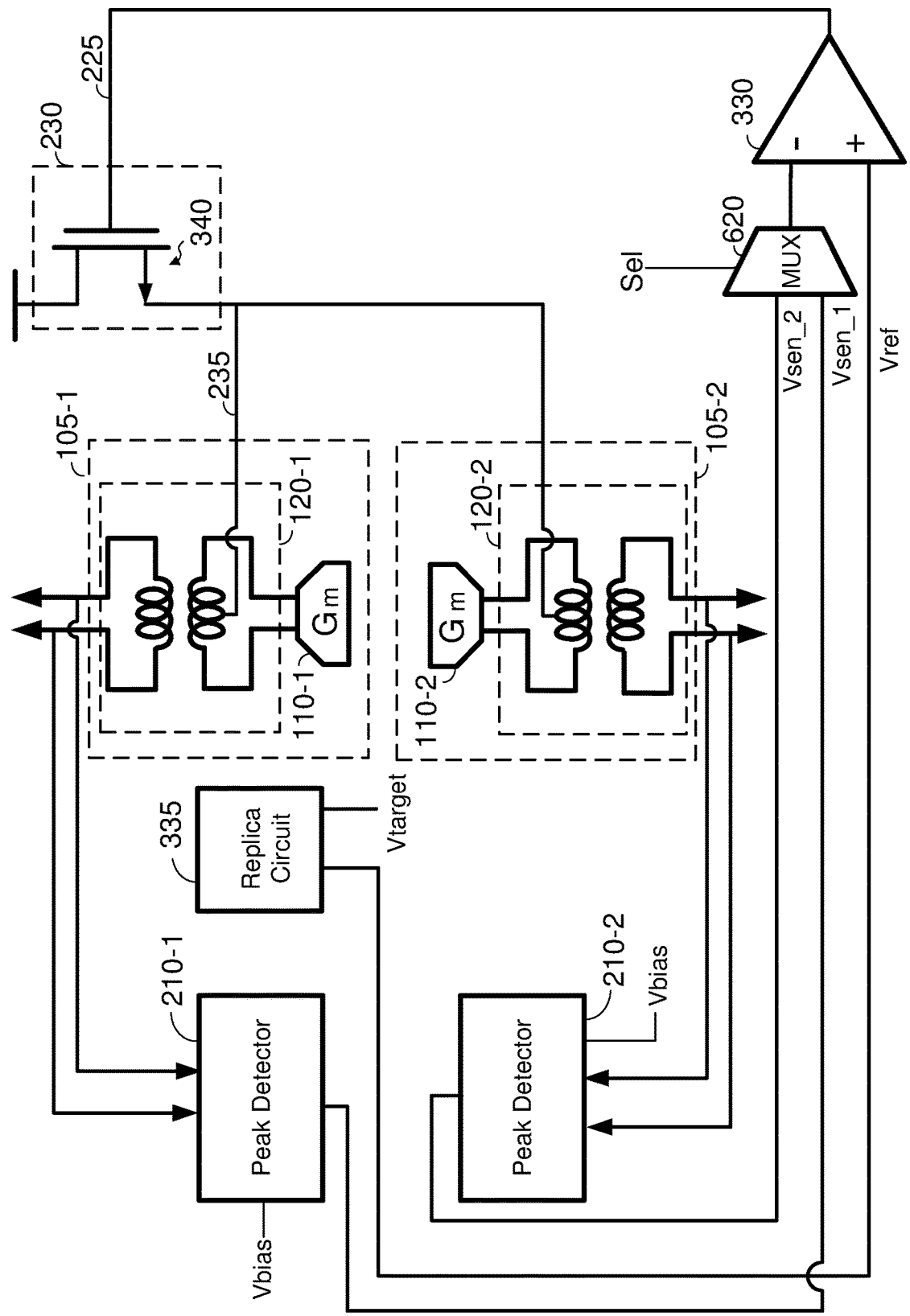
FIG. 6B shows another example of a feedback circuit capable of switching between multiple buffers according to certain aspects of the present disclosure.

Although FIG. 6A shows an example in which the feedback circuit includes separate replica circuits 335-1 and 335-2 for the first and second buffers 105-1 and 105-2, it is to be appreciated that the present disclosure is not limited to this example. For example, FIG. 6B shows an example in which the feedback circuit includes a common replica circuit 335 for the first and second buffers 105-1 and 105-2 instead of the separate replica circuits 335-1 and 335-2 shown in FIG. 6A. In this example, the reference voltage (labeled "Vref") generated by the replica circuit 335 is coupled to the positive input of the amplifier 330. Similar to the multiplexer 610 in FIG. 6A, the multiplexer 620 selects one of the sense voltages (labeled "Vsen_1" and "Vsen_2") based on the select signal (labeled "Sel"), and couples the selected sense voltage to the minus input of the amplifier 330. In this example, the multiplexer 620 does not need to select between the reference voltages (labeled "Vref_1" and "Vref_2") shown in FIG. 6A since the buffers 105-1 and 105-2 share the replica circuit 335 in this example.

Figure 6C:
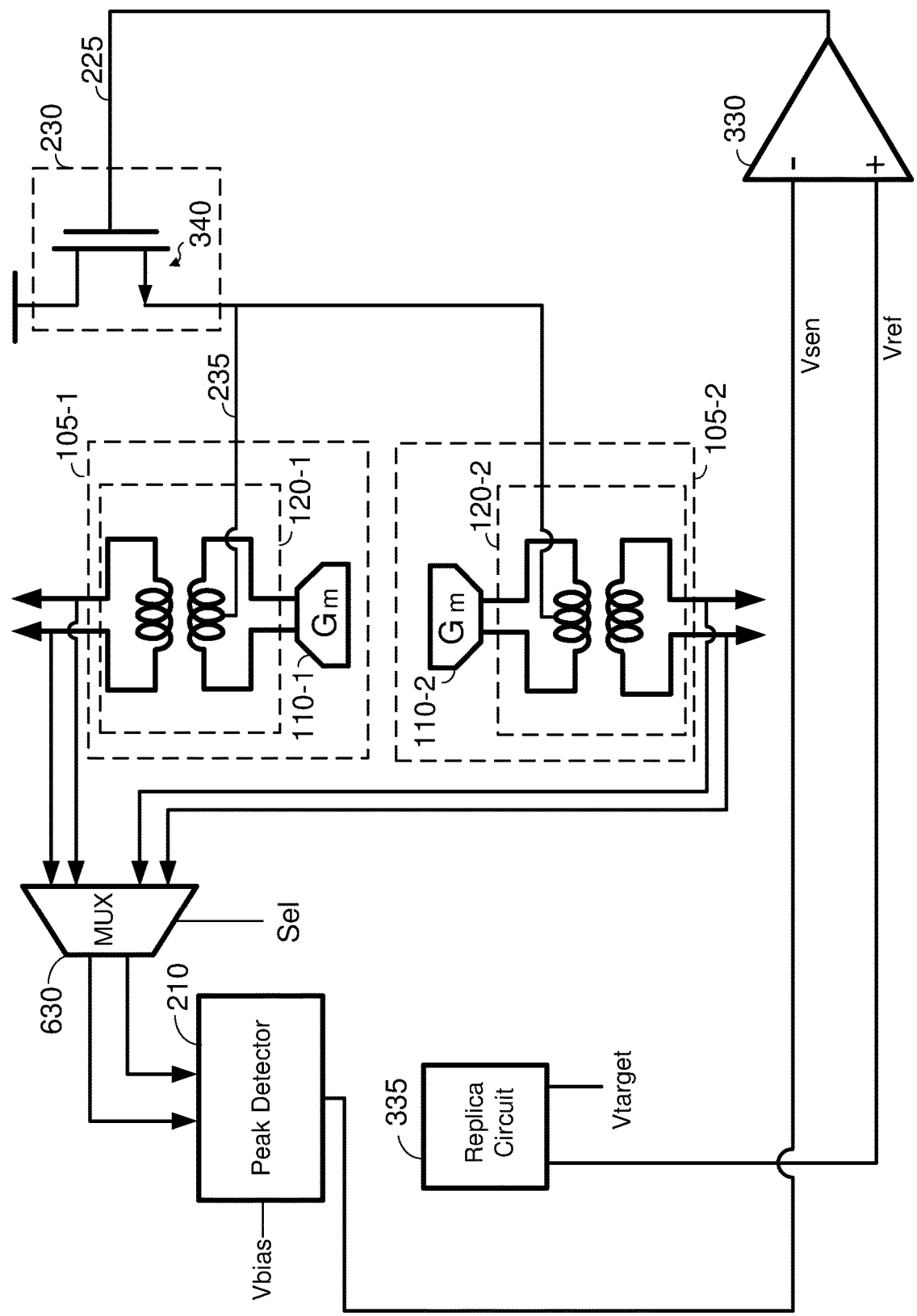
FIG. 6C shows yet another example of a feedback circuit capable of switching between multiple buffers according to certain aspects of the present disclosure.

FIG. 6C shows another example in which the feedback circuit includes a common peak detector 210 for the buffers 105-1 and 105-2. In this example, the sense voltage generated by the peak detector 210 is coupled to the minus input of the amplifier 330. In this example, the feedback circuit includes a multiplexer 630 configured to selectively couple the differential output of one of the first and second buffers 105-1 and 105-2 to the peak detector 210 at a time. The multiplexer 630 includes a first differential input coupled to the differential output of the first buffer 105-1, a second differential input coupled to the differential output of the second buffer 105-2, and a differential output coupled to the differential input of the peak detector 210. In operation, the multiplexer 630 selects the differential output of one of the first and second buffers 105-1 and 105-2 based on the select signal (labeled "Sel"), and couples the selected differential output to the peak detector 210. In certain aspects, the select signal selects the differential output of the buffer corresponding to the mixer that is currently being used.

Figure 7:
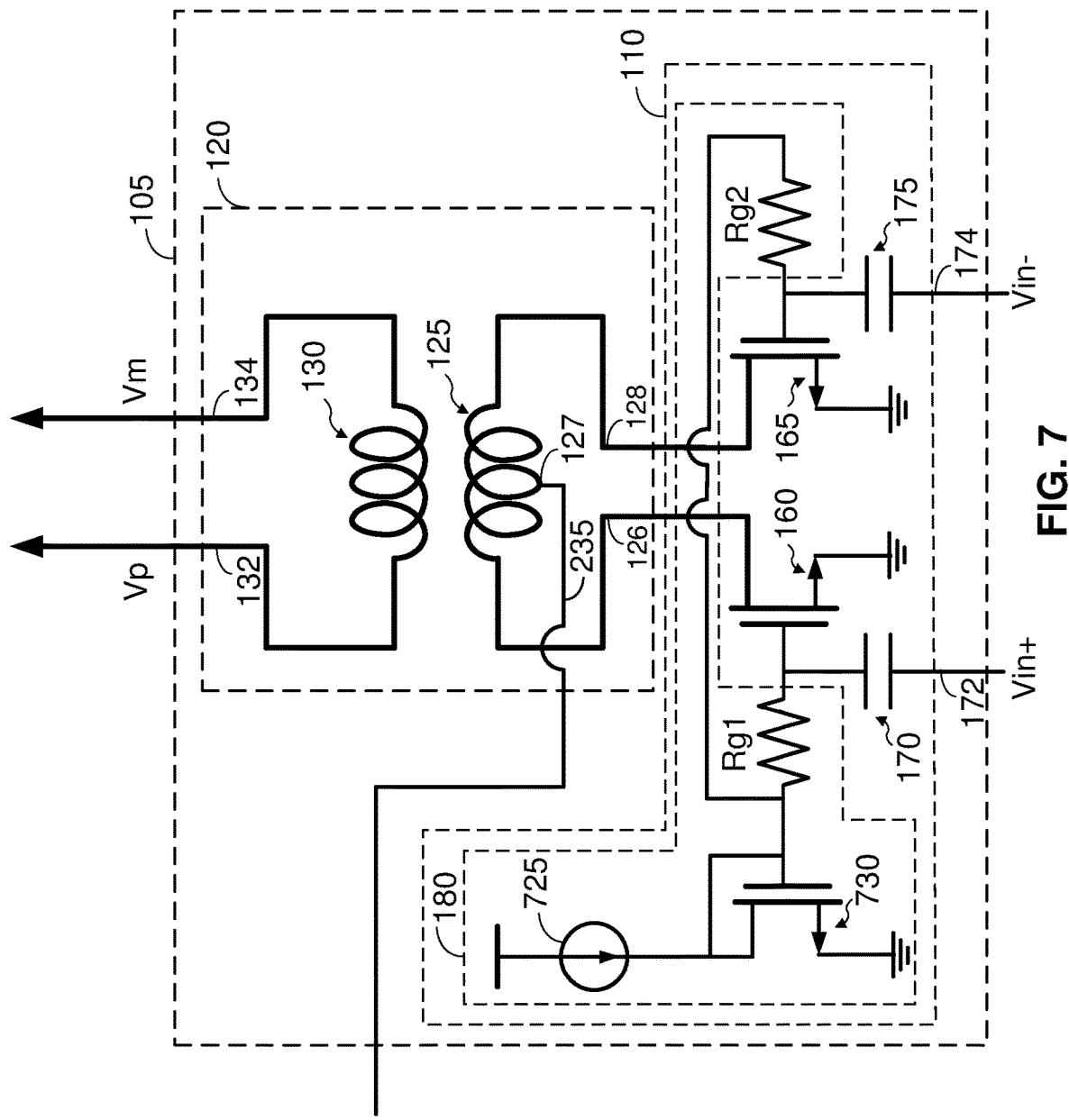
FIG. 7 shows an exemplary implementation of a transconductance driver according to certain aspects of the present disclosure.

FIG. 7 shows an exemplary implementation of the bias circuit 180 in the transconductance driver 110 according to certain aspects of the present disclosure. In this example, the bias circuit 180 includes a current source 725 and a current-mirror transistor 730 (e.g., NFET) for setting the bias current of the transconductance driver 110. The current source 725 is configured to source a current (e.g., a DC current). The current source 725 is coupled between the supply rail and the drain of the current-mirror transistor 730. The drain and gate of the current-mirror transistor 730 are tied together, and the source of the current-mirror transistor 730 is coupled to ground. The gate of the current-mirror transistor 730 is coupled to the gate of the first transistor 160 through a first gate resistor (labeled "Rg1") and the gate of the second transistor 165 through a second gate resistor (labeled "Rg2"). The current-mirror transistor 730 forms a current mirror with the first and second transistors 160 and 165, in which the current mirror biases the gates of the first and second transistors 160 and 165 such that the current flowing into the current-mirror transistor 730 from the current source 725 is mirrored at the first and second transistors 160 and 165.

In operation, the current of the current source 725 flows into the current-mirror transistor 730, and is mirrored at the first and second transistors 160 and 165. As a result, the bias current at the first transistor 160 is equal to or proportional to the current sourced by the current source 725, and the bias current at the second transistor 165 that is equal to or proportional to the current sourced by the current source 725. Thus, in this example, the bias current of the transconductance driver 110 is set by the current of the current source 725. As discussed further below, the current source 725 may have an adjustable current to enable adjustment of the bias current of the transconductance driver 110.

Figure 8:
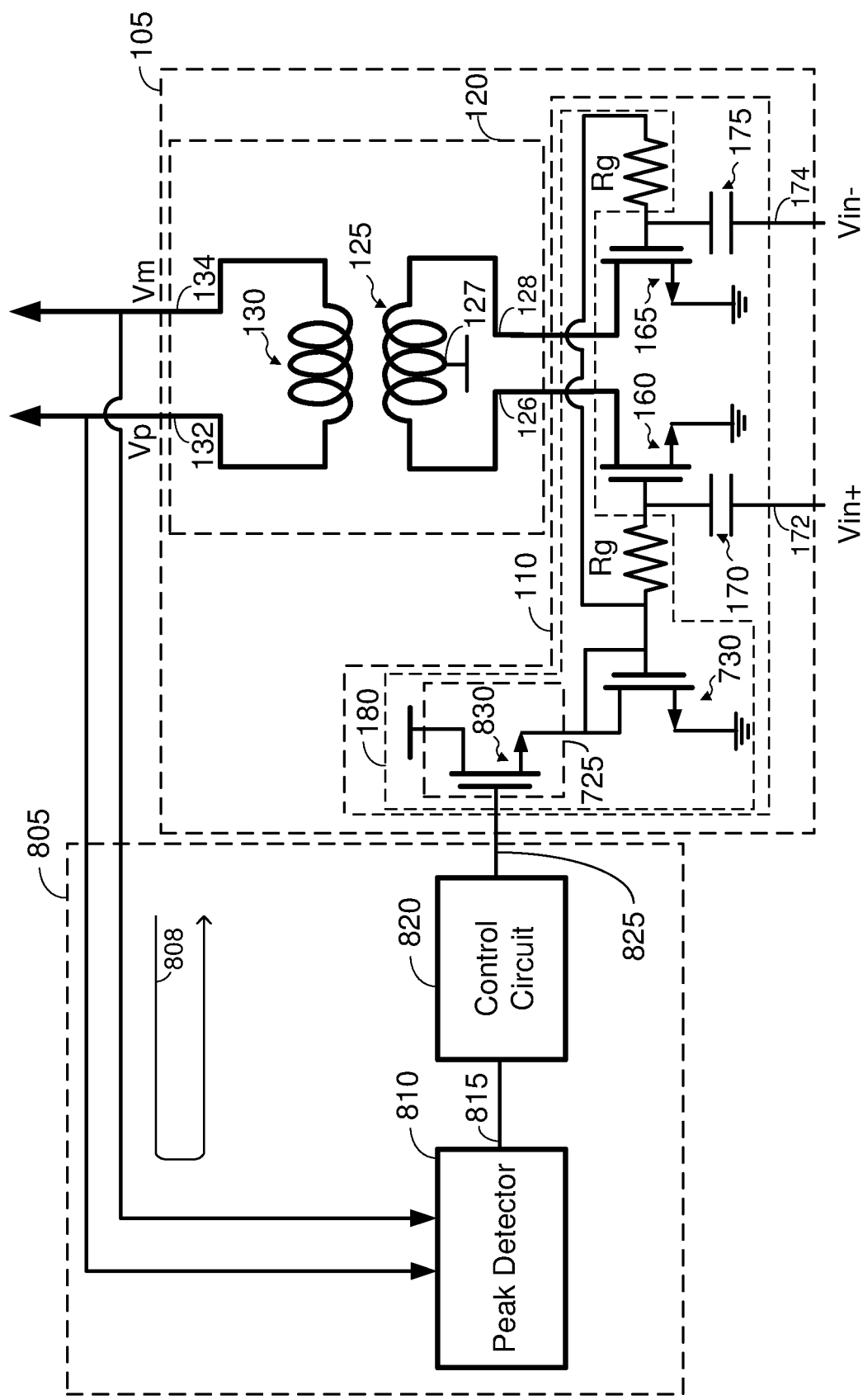
FIG. 8 shows another example of a feedback circuit for tracking and controlling the output voltage swing of a buffer according to certain aspects of the present disclosure.

FIG. 8 shows another example of a feedback circuit 805 for tracking and controlling the output voltage swing of the buffer 105 according to certain aspects of the present disclosure. The feedback circuit 805 adjusts the output voltage swing of the buffer 105 by adjusting the bias current of the transconductance driver 110. Thus, in this example, the bias current of the transconductance driver 110 is the parameter that is adjusted to control the output voltage swing instead of the regulated voltage 235 at the input inductor 125.

In the example in FIG. 8, the center tap 127 of the input inductor 125 is coupled to the voltage supply rail. Also, the current source 725 in the transconductance driver 110 has an adjustable current that allows the feedback circuit 805 to electrically adjust the bias current of the transconductance driver 110, as discussed further below. In the example in FIG. 8, the current source 725 is implemented with a current-source transistor 830 (e.g., NI-ET), in which the drain of the current-source transistor 830 is coupled to the supply rail, and the source of the current-source transistor 830 is coupled to the drain of the current-mirror transistor 730. In this example, the current of the current source 725 is controlled by the gate voltage of the current-source transistor 830. Since the current of the current source 725 is mirrored at the first and second transistors 160 and 165 by the current-mirror transistor 730, the gate voltage of the current-source transistor 830 controls the bias current at the first and second transistors 160 and 165. In this example, the current bias may increase when the gate voltage is increased, and decrease when the gate voltage is decreased.

In certain aspects, the feedback circuit 805 is configured to detect the output voltage swing at the output inductor 130, and control the bias current of the transconductance driver 110 based on the detected output voltage swing. In these aspects, the feedback circuit 805 may control the bias current based on the detected output voltage swing by comparing the detected output voltage swing with a target voltage swing, and adjusting the bias current in a direction that reduces the difference between the output voltage swing and the target voltage swing. In the example in FIG. 8, the feedback circuit 805 controls the bias current of the transconductance driver 110 by controlling the gate voltage of the current-source transistor 830, as discussed above.

In the example in FIG. 8, the feedback circuit 805 includes a peak detector 810 and a control circuit 820 coupled in a feedback loop 808. The peak detector 810 has a differential input coupled to the differential output of the buffer 105. The peak detector 810 is configured to detect the output voltage swing at the differential output of the buffer 105, and generate a swing detection signal 815 based on the detected output voltage swing. The output voltage swing may be approximately equal to the peak difference between the voltage Vp at the positive output the buffer 105 and the voltage Vm at the minus output of the buffer 105. In certain aspects, the swing detection signal 815 may be a voltage that is related (e.g., proportional) to the output voltage swing of the buffer 105.

The control circuit 820 is configured to receive the swing detection signal 815 from the peak detector 810, and generate a control signal 825 based on the swing detection signal 815. The control signal 825 is input to the transconductance driver 110 to control the current bias of the transconductance driver 110. For the example in which the current source 725 is implemented with the current-source transistor 830, the control signal 825 is input to the gate of the current-source transistor 830 and controls the current of the current-source transistor 830 by controlling the gate voltage of the current-source transistor 830. Since the current of the current-source transistor 830 is mirrored at the first and second transistors 160 and 165, the control signal 825 controls the bias current at the first and second transistors 160 and 165.

In certain aspects, the control circuit 820 generates the control signal 825 by comparing the swing detection signal 815 with a target reference signal corresponding to the target voltage swing, and generating the control signal 825 based on the comparison. In these aspects, the target reference signal provides a reference point with which the swing detection signal 815 is compared to assess whether the output voltage swing is above or below the target voltage swing. In one example, the output voltage swing is approximately equal to the target voltage swing when the swing detection signal 815 is approximately equal to the reference target signal. In this example, the reference target signal indicates the value (e.g., voltage) that the swing detection signal 815 should have when the output voltage swing is equal to the target voltage swing. If the swing detection signal 815 is above the reference target signal, then the output voltage swing is above the target voltage swing, and, if the swing detection signal 815 is below the reference target signal, then the output voltage swing is below the target voltage swing. In this example, the control circuit 820 adjusts the output voltage swing to be closer to the target voltage swing by adjusting the bias current of the transconductance driver 110 in a direction that reduces the difference between the swing detection signal 815 and the target reference signal.

Thus, the feedback circuit 805 adjusts the bias current of the transconductance driver 110 based on feedback of the output voltage swing to keep the output voltage swing of the buffer 105 close to the target voltage swing. The feedback circuit 805 is able to keep the output voltage swing close to the target voltage swing across PVT corners, thereby significantly reducing variation in the output voltage swing across PVT corners. The reduced swing variation across PVT corners mitigates the excess power consumption, signal path gain variation, increased LO leakage, and/or reliability issues discussed above with reference to FIG. 1. Further, when the buffer 105 is placed at the end of an LO path, the feedback circuit 805 is able to clean up swing variation caused by one or more others devices (e.g., amplifier, phase shifter, etc.) in the LO path preceding the buffer 105, as discussed above.

The output voltage swing of the buffer 105 may increase exponentially with bias current, causing the loop gain of the feedback loop 808 to vary drastically, especially at low output swing. As a result, it may be more difficult to achieve good loop stability for the feedback loop 808 compared with the feedback loop 208, in which the approximately linear relationship between the regulated voltage 235 and the output voltage swing provides better loop stability.

Figure 9:
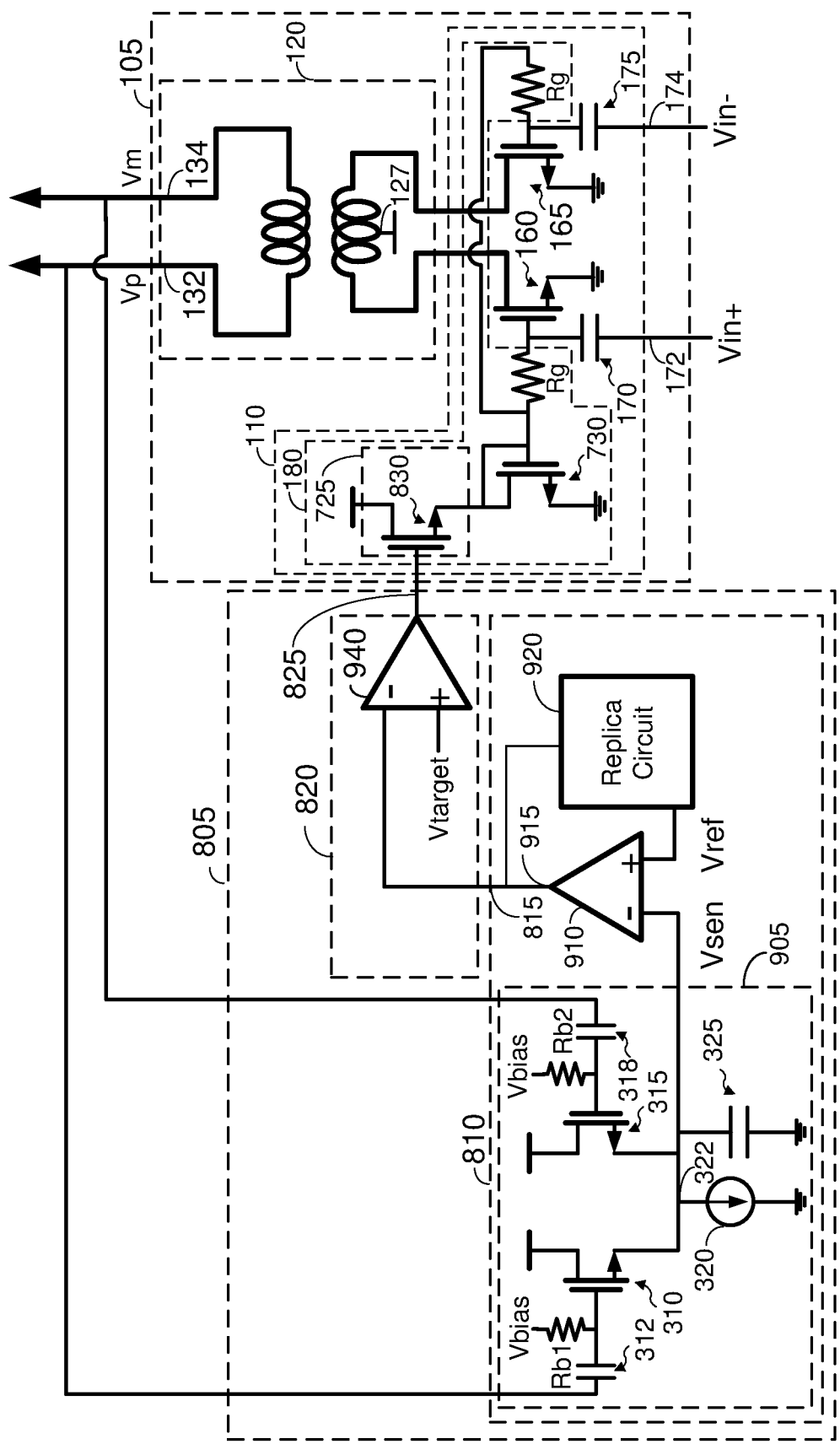
FIG. 9 shows other exemplary implementations of a peak detector and a control circuit according to certain aspects of the present disclosure.

FIG. 9 shows exemplary implementations of the peak detector 810 and the control circuit 820 according to certain aspects of the present disclosure. In the example in FIG. 9, the peak detector 810 includes a peak detector 905 implemented using the exemplary peak detector 210 shown in FIG. 3. Accordingly, the description of the exemplary peak detector 210 in FIG. 3 applies to the peak detector 905 in FIG. 9, and is therefore not repeated here for brevity. The peak detector 905 generates the sense voltage Vsen at node 322 based on the output voltage swing. As discussed above, the sense voltage Vsen is related to the output voltage swing (e.g., by a ratio that depends on the bias voltage Vbias).

In this example, the peak detector 810 also includes an operational amplifier 910 and a replica circuit 920. The operational amplifier 910 and the replica circuit 920 are used to reduce the PVT effect on the sense voltage Vsen to generate a more accurate swing detection signal 815, as discussed further below. The replica circuit 920 may be implemented with the exemplary replica circuit 335 shown in FIG. 4. However, in this example, the gates of the first and second transistors 410 and 415 (shown in FIG. 4) are coupled to the output 915 of the operational amplifier 910 instead of being biased by the target voltage Vtarget. The replica circuit 920 generates the reference voltage Vref based on the output voltage of the operational amplifier 910. Note that the replica circuit 920 in this example in not used to set the target voltage swing.

The sense voltage Vsen is input to the minus input of the operational amplifier 910, and the reference voltage Vref is input to the positive input of the operation amplifier 910. The output 915 of the operational amplifier 910 provides the swing detection signal 815 discussed above. The output 915 of the operational amplifier 910 is also coupled to the gates of the first and second transistors 410 and 415 (shown in FIG. 4) of the replica circuit 920.

As discussed above, the replica circuit 920 is used to cancel out variation in the sense voltage Vsen due to PVT conditions. In this regard, the replica circuit 920 may be integrated on the same chip (i.e., die) as the peak detector 905. In an aspect, the replica circuit 920 may be located in close proximity to the peak detector 905 so that the replica circuit 920 is subjected to approximately the same PVT conditions as the peak detector 905. As a result, the variation in the reference voltage Vref due to PVT conditions is approximately the same as the variation in the sense voltage Vsen due to PVT conditions. Since the operational amplifier 910 takes the difference of the sense voltage Vsen and the reference voltage Vref at its inputs, variation in the reference voltage Vref due to PVT conditions approximately cancels out the variation in the sense voltage Vsen due to PVT conditions. This reduces the PVT effect on the output voltage 915 of the operational amplifier 910. The output 915 of the operational amplifier 910 provides the swing detection signal 815 discussed above, in which the PVT effect is reduced on the swing detection signal 815 using the replica circuit 920.

The control circuit 820 includes a control amplifier 940 (e.g., an operational amplifier). The output voltage 915 of the operational amplifier 910 is input to the minus input of the control amplifier 940, and the target voltage Vtarget is input to the positive input of the control amplifier 940. The output of the control amplifier 940 provides the control signal 825 to the current source 725 of the transconductance driver 110. In this example, the target voltage Vtarget corresponds to the target reference signal discussed above.

In operation, the control amplifier 940 adjusts the control signal 825 in a direction that reduces the difference between the output voltage 915 of the operational amplifier 910 and the target voltage Vtarget (i.e., adjusts the output voltage 915 to be closer to the target voltage Vtarget). As a result, the control amplifier 940 forces the output voltage 915 of the operational amplifier 910 to be approximately equal to the target voltage Vtarget. This occurs when the output voltage swing of the buffer 105 is approximately equal to alpha*(Vtarget−Vbias), where alpha is a linear coefficient. As a result, the feedback circuit 805 adjusts the bias current such that the output voltage swing of the buffer 105 is approximately equal to alpha*(Vtarget−Vbias). Thus, in this example, the target voltage swing of the feedback circuit 805 is approximately equal to alpha*(Vtarget−Vbias).

Therefore, for a given bias voltage Vbias, the target voltage swing may be set by setting the target voltage Vtarget input to the control amplifier 940 according to the desired target voltage swing. The bias voltage Vbias and the Vtarget may be generated by the voltage generator 350 shown in FIG. 3. The voltage generator 350 may be configured to set the voltage levels of the bias voltage Vbias and the target voltage Vtarget such that alpha*(Vtarget−Vbias) equals the desired target voltage swing. Alpha may be determined by running simulations and/or performing measurements on the feedback circuit 805 and buffer 105.

Note that in the example in FIG. 9, the reference voltage Vref is used for canceling out the PVT effect on the sense voltage Vsen. In the example in FIG. 3, the reference voltage Vref is used for both setting the target voltage swing and canceling out the PVT effect.

Figure 10:
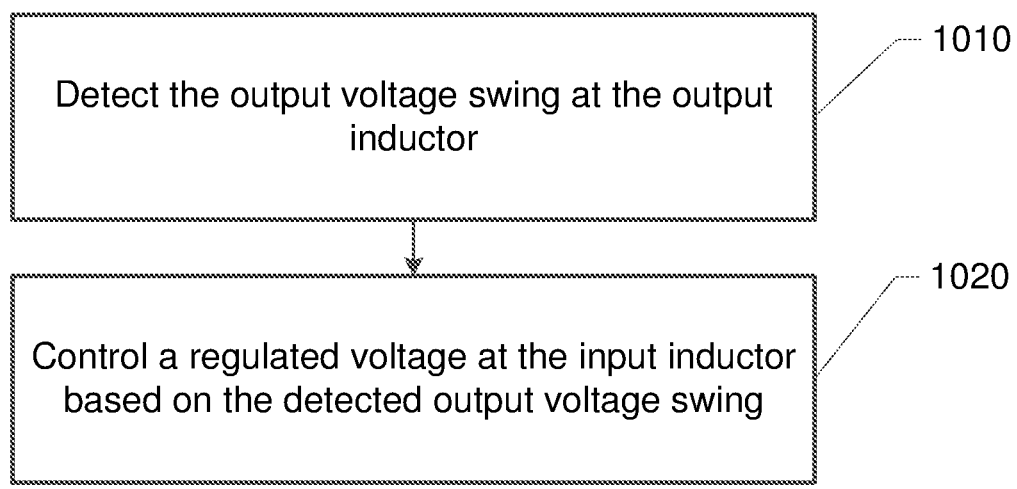
FIG. 10 is a flowchart showing a method for controlling an output voltage swing of a buffer according to certain aspects of the present disclosure.

FIG. 10 shows an exemplary method 1000 for controlling an output voltage swing of a buffer according to certain aspects of the present disclosure. The buffer (e.g., buffer 105) includes a transformer (e.g., transformer 120) and a driver (e.g., transconductance driver 110), the transformer includes an input inductor (e.g., input inductor 125) and an output inductor (e.g., output inductor 130), the input inductor is driven by the driver, and the input inductor is magnetically coupled to the output inductor. The method 1000 may be performed by the feedback circuit 205.

At block 1010, the output voltage swing is detected at the output inductor. For example, the output voltage swing may be detected using a peak detector (e.g., peak detector 210).

At block 1020, a regulated voltage at the input inductor is controlled based on the detected output voltage swing. The regulated voltage (e.g., regulated voltage 235) may be applied to a center tap of the input inductor.

In certain aspects, controlling the regulated voltage based on the detected output voltage swing may include comparing the detected output voltage swing with a target voltage swing, and controlling the regulated voltage based on the comparison. Controlling the regulated voltage based on the comparison may include adjusting the regulated voltage in a direction that reduces a difference between the output voltage swing and the target voltage swing.

Buffers according to aspects of the present disclosure may be employed in a wireless communication device (e.g., a wireless mobile device, a base station, customer premises equipment (CPE), etc.) to buffer one or more LO signals distributed to mixers in the device. In certain aspects, the wireless communication device (e.g., a 5G device) includes a phased antenna array that allows the device to receive and/or transmit signals with high directivity using beamforming for increased range. In these aspects, the mixers may be used in a receiver and/or a transmitter for the phased antenna array.

Figure 11:
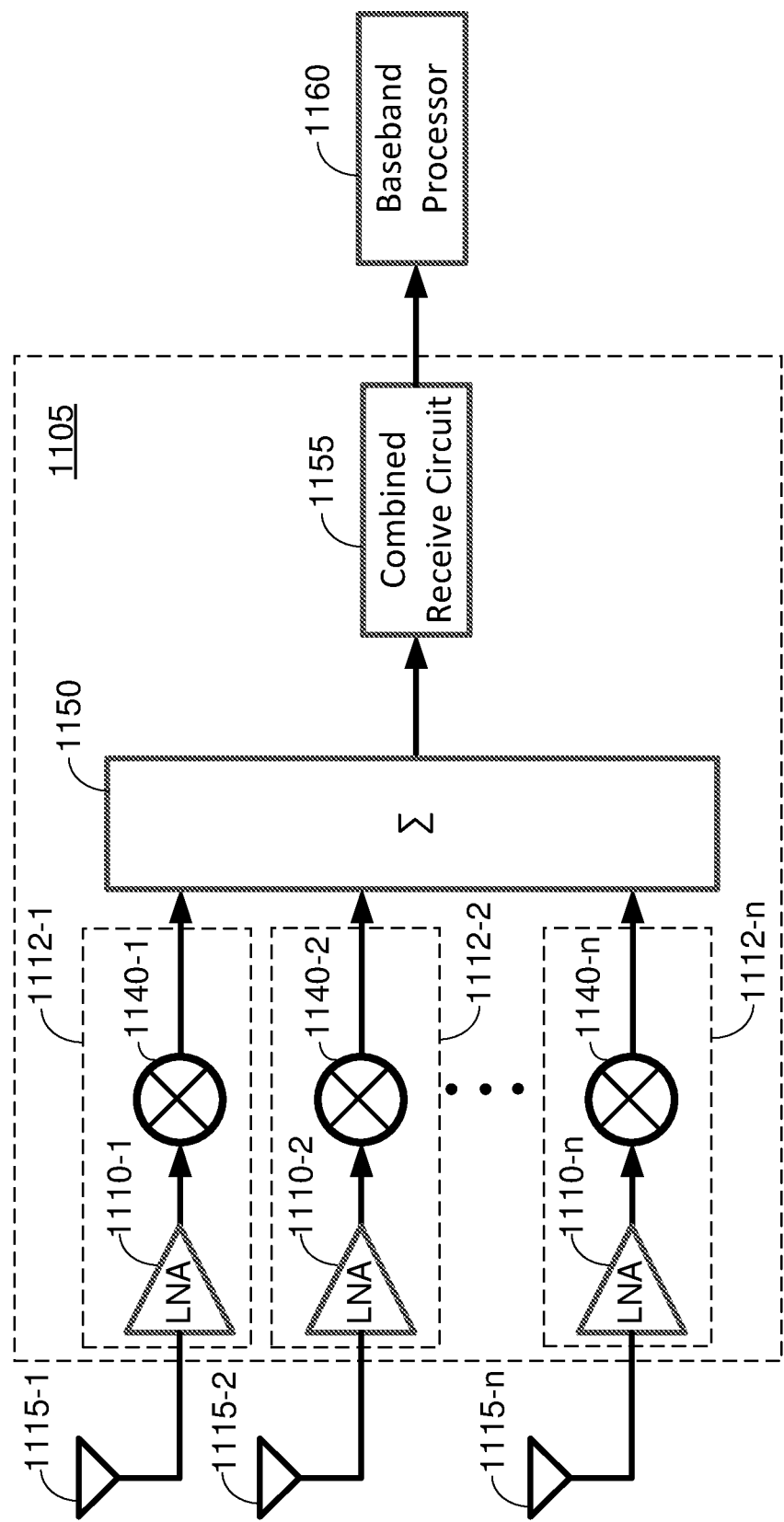
FIG. 11 shows an example of a receiver for a phased antenna array according to certain aspects of the present disclosure.

In this regard, FIG. 11 shows an example of a receiver 1105 configured to receive signals from antennas 1115-1 to 1115-n in a phased antenna array. In this example, the receiver 1105 includes multiple receive chains 1112-1 to 1112-n, in which each of the receive chains 1112-1 to 1112-n is coupled to a respective one of the antennas 1115-1 to 1115-n. Each of the receive chains 1112-1 to 1112-n includes a respective low noise amplifier (LNA) 1110-1 to 1110-n and a respective mixer 1140-1 to 1140-n. In each receive chain 1112-1 to 1112-n, the respective LNA 1110-1 to 1110-n is configured to amplify the signal from the respective antenna 1115-1 to 1115-n in the array, and the respective mixer 1140-1 to 1140-n is configured to mix the signal from the respective LNA 1110-1 to 1110-n with a respective LO signal to downconvert the frequency of the signal. In this example, the LO signal to each mixer 1140-1 to 1140-n is phase shifted by a respective phase shift prior to mixing to set the receive direction of the phased antenna array using beamforming. For each mixer 1140-1 to 1140-n, the phase shift of the respective LO signal may be set based on a desired receive direction for the phased antenna array. It is to be appreciated that each receive chain may include one or more additional components (not shown).

The receiver 1105 also includes a combiner 1150 and a combined receive circuit 1155.

The combiner 1150 is configured to combine the output signals of the receive chains 1112-1 to 1112-n into a combined signal. The combiner 1150 outputs the combined signal to the combined receive circuit 1155, which processes the combined signal. Processing performed by the combined receive circuit 1155 may include amplification, filtering, analog-to-digital conversion, etc. The combined receive circuit 1155 outputs the processed combined signal to a baseband processor 1160, which may process the signal from the combined receive circuit 1155 to recover data from the signal. The recovered data may be stored in a memory on the wireless communication device and/or sent to another processor (e.g., a central processing unit (CPU)) for further processing.

Figure 12:
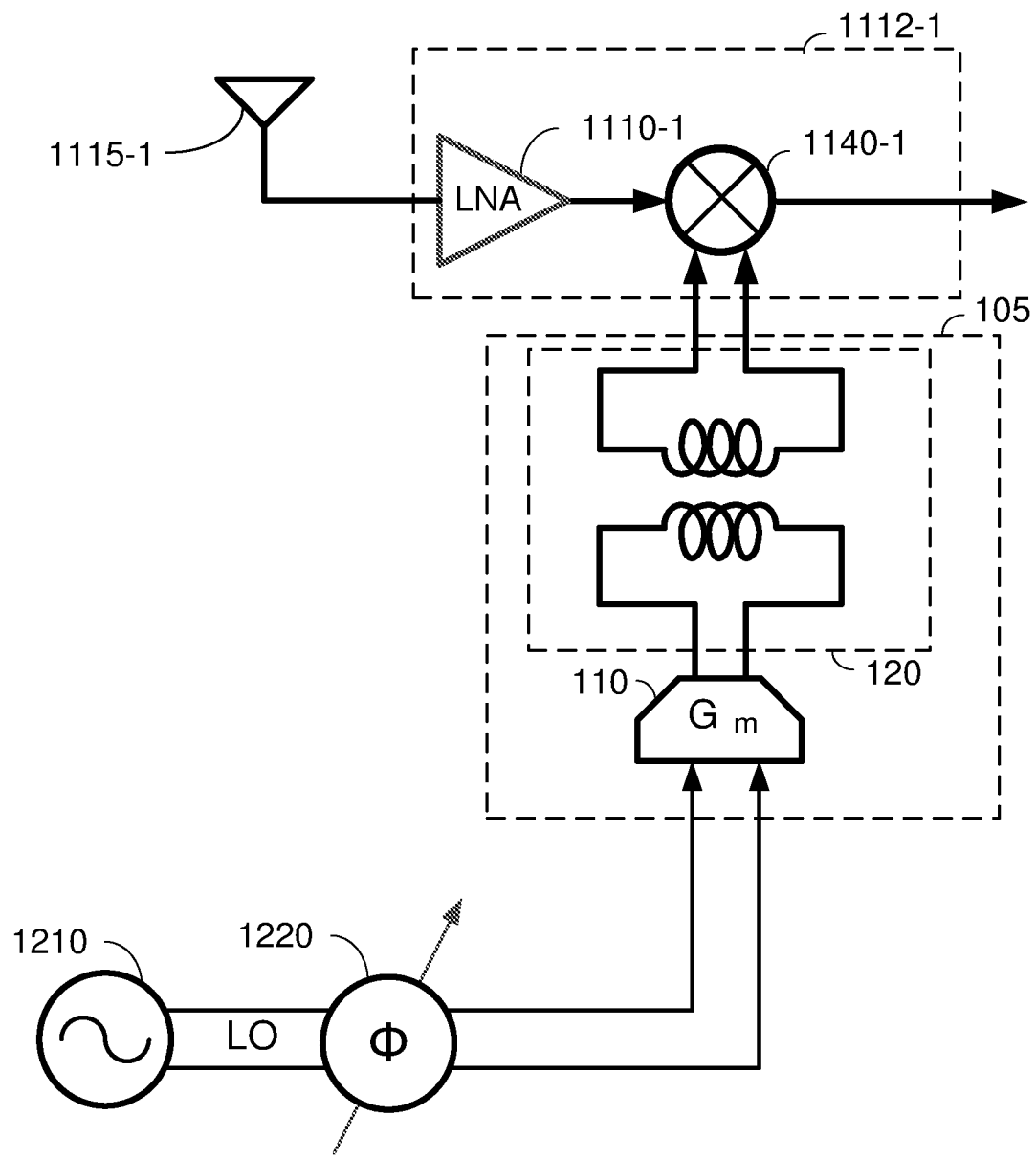
FIG. 12 shows an example of an LO network for providing an LO signal to a mixer in the receiver shown in FIG. 11 according to certain aspects of the present disclosure.

FIG. 12 shows an example of an LO network for providing the LO signal to the mixer 1140-1 in receive chain 1112-1. In this example, the LO network includes an LO 1210, a phase shifter 1220, and a buffer 105 coupled to the mixer 1140-1. The output voltage swing of the buffer 105 may be controlled using the exemplary feedback circuit 205 shown in FIG. 2 or the exemplary feedback circuit 805 shown in FIG. 8. In this example, the LO 1210 is coupled to the phase shifter 1220, and the phase shifter 1220 is coupled to the input of the buffer 105. In operation, the LO 1210 generates an LO signal, and the phase shifter 1220 shifts the phase of the LO signal based on a desired receive direction for the phased antenna array. The buffer 105 receives the phase-shifted LO signal from the phase shifter 1220 and drives the mixer 1140-1 based on the phase-shifted LO signal. It is to be appreciated that the LO network may include one or more additional components (not shown) in the LO path between the LO 1210 and the mixer 1140-1.

It is to be appreciated that the LO signal for each of the other mixers 1140-2 to 1140-n shown in FIG. 11 may be provided by a respective LO network similar to the one shown in FIG. 12. In one example, the LO networks may share a common LO 1210, in which each LO network phase shifts the LO signal from the LO 1210 by a respective phase shift based on the desired receive direction for the phased antenna array.

Figure 13:
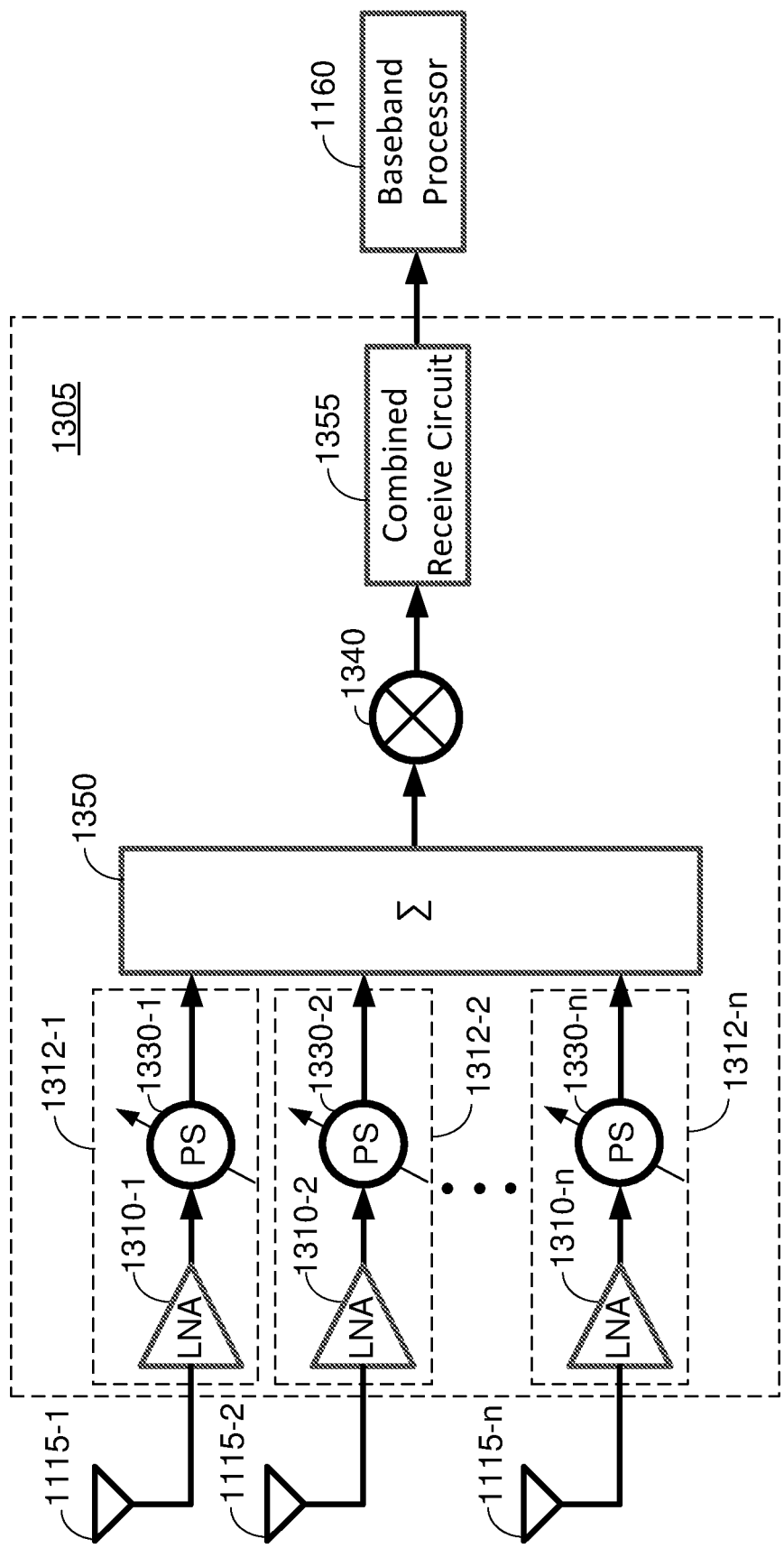
FIG. 13 shows another example of a receiver for a phased antenna array according to certain aspects of the present disclosure.

FIG. 13 shows another example of a receiver 1305 configured to receive signals from the antennas 1115-1 to 1115-n in the phased antenna array. In this example, the frequency conversion is performed after signal combining, as discussed further below. In this example, the receiver 1305 includes multiple receive chains 1312-1 to 1312-n, in which each of the receive chains 1312-1 to 1312-n is coupled to a respective one of the antennas 1115-1 to 1115-n. Each of the receive chains 1312-1 to 1312-n includes a respective LNA 1310-1 to 1310-n and a respective phase shifter 1330-1 to 1330-n. In each receive chain 1312-1 to 1312-n, the respective LNA 1310-1 to 1310-n is configured to amplify the signal from the respective antenna 1115-1 to 1115-n in the array, and the respective the phase shifter 1330-1 to 1330-n is configured shift the phase of the signal from the respective LNA 1310-1 to 1310-n by a respective phase shift. The phase shift for each phase shifter 1330-1 to 1330-n may be set based on a desired receive direction for the phased antenna array using beamforming. It is to be appreciated that each receive chain may include one or more additional components (not shown).

The receiver 1305 also includes a combiner 1350, a mixer 1340, and a combined receive circuit 1315. The combiner 1350 is configured to combine the output signals of the receive chains 1312-1 to 1312-n into a combined signal. The combiner 1350 outputs the combined signal to the mixer 1340. The mixer 1340 mixes the combined signal with an LO signal to downconvert the frequency of the combined signal. The mixer 1340 outputs the frequency downconverted signal to the combined receive circuit 1355, which processes the combined signal. Processing performed by the combined receive circuit 1355 may include amplification, filtering, analog-to-digital conversion, etc. The combined receive circuit 1355 outputs the combined signal to a baseband processor 1160, which may process the combined signal from the combined receive circuit 1355 to recover data from the signal. The recovered data may be stored in a memory on the wireless communication device and/or sent to another processor (e.g., a CPU) for further processing.

Figure 14:
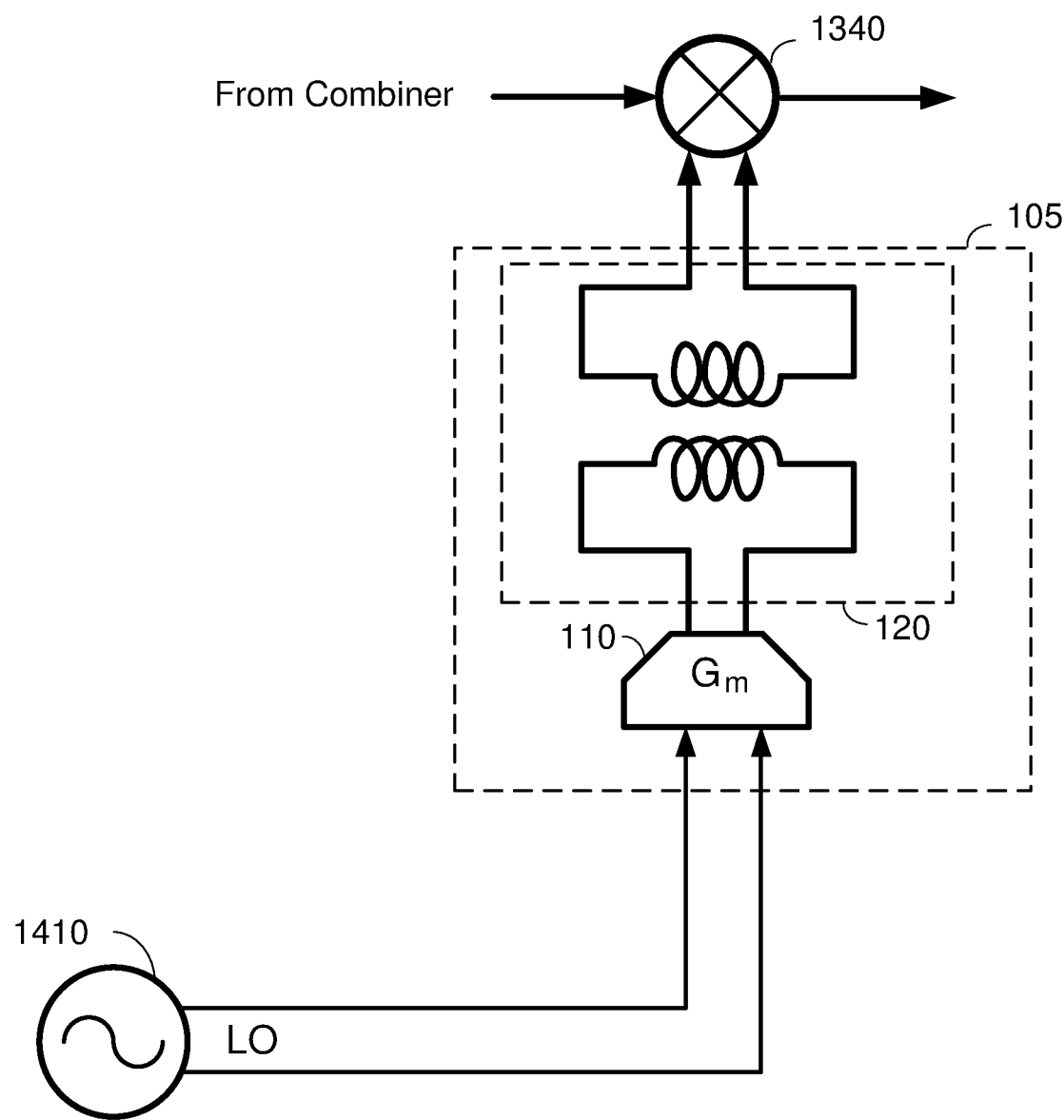
FIG. 14 shows an example of an LO network for providing an LO signal to a mixer in the receiver shown in FIG. 13 according to certain aspects of the present disclosure.

FIG. 14 shows an example of an LO network for providing the LO signal to the mixer 1340 in the receiver 1305. In this example, the LO network includes an LO 1410, and a buffer 105 coupled to the mixer 1340. The output voltage swing of the buffer 105 may be controlled using the exemplary feedback circuit 205 shown in FIG. 2 or the exemplary feedback circuit 805 shown in FIG. 8. In this example, the LO 1410 is coupled to the input of the buffer 105. In operation, the LO 1410 generates an LO signal, which is input to the input of the buffer 105. The buffer 105 receives the LO signal and drives the mixer 1340 based on the LO signal. It is to be appreciated that the LO network may include one or more additional components (not shown) in the LO path between the LO 1410 and the mixer 1340.

Figure 15:
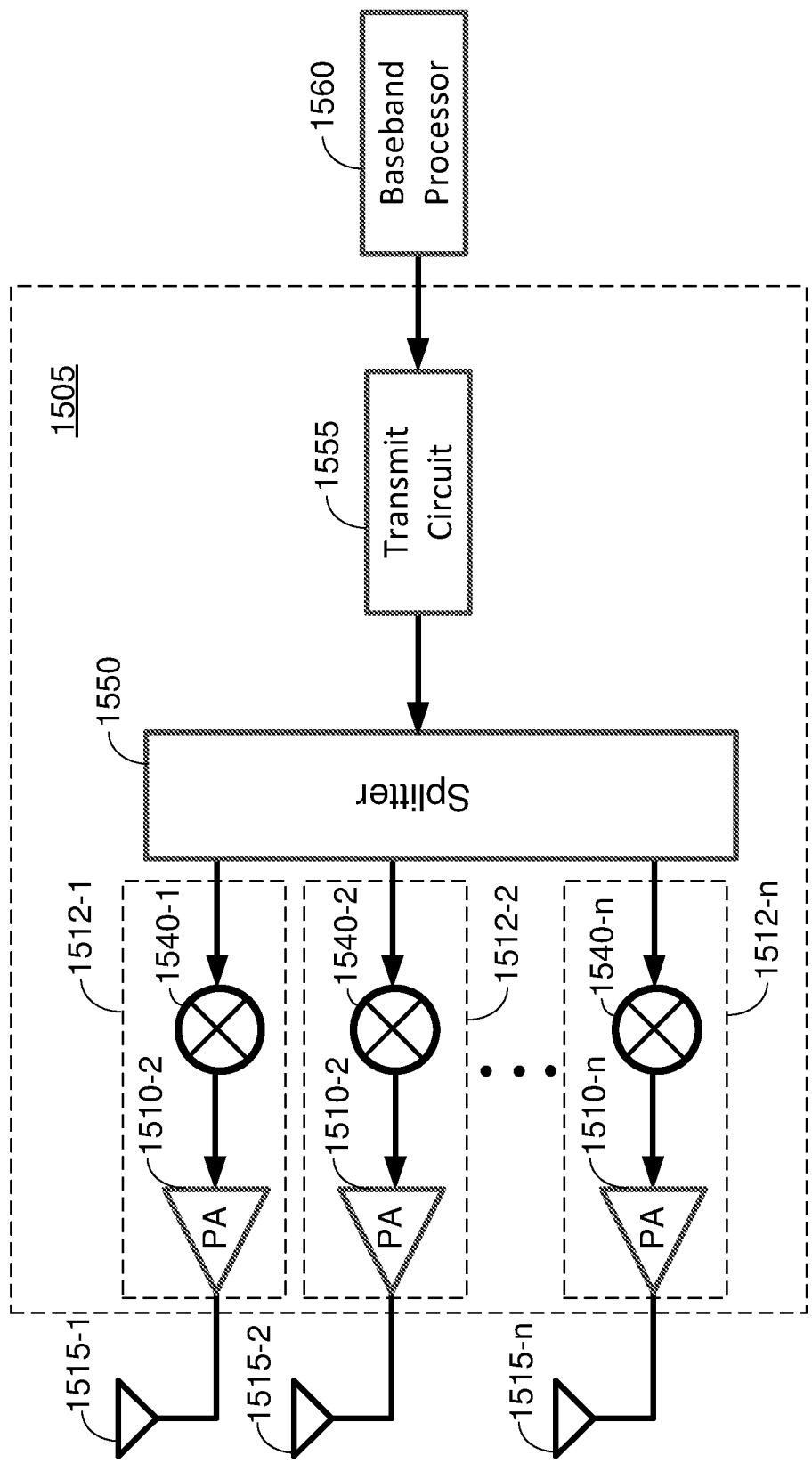
FIG. 15 shows an example of a transmitter for a phased antenna array according to certain aspects of the present disclosure.

FIG. 15 shows an example of a transmitter 1505 for a phased antenna array according to aspects of the present disclosure. In this example, the transmitter 1505 includes a transmit circuit 1555, a splitter 1550, and multiple transmit chains 1512-1 to 1512-$n$. Each of the transmit chains 1512-1 to 1512-$n$ has an input coupled to the splitter 1550 and an output coupled to a respective one of the antennas 1515-1 to 1515-$n$ in the phased antenna array.

In operation, a baseband processor 1560 outputs a signal to the transmit circuit 1555. The transmit circuit 1555 processes the received signal for transmission. Processing performed by the transmit circuit 1555 may include digital-to-analog conversion, amplification, etc. The transmit circuit 1555 outputs the processed signal to the splitter 1550. The splitter 1550 splits the signal from the transmit circuit 1555 into multiple signals, and inputs each of the multiple signals to a respective one of the transmit chains 1512-1 to 1512-$n$.

Each of the transmit chains 1512-1 to 1512-$n$ includes a respective mixer 1540-1 to 1540-$n$ and a respective power amplifier (PA) 1510-1 to 1510-$n$. In each transmit chain 1512-1 to 1512-$n$, the respective mixer 1540-1 to 1540 mixes the respective signal from the splitter 1555 with a respective LO signal, and the respective PA 1510-1 to 1510-$n$ amplifies the signal from the respective mixer. The output signal of each transmit chain 1512-1 to 1512-$n$ is fed to the respective antenna 1515-1 to 1515-$n$ in the phased antenna array. In this example, the LO signal to each mixer 1540-1 to 1540-$n$ is phase shifted by a respective phase shift prior to mixing to set the transmit direction of the phased antenna array using beamforming. For each mixer 1540-1 to 1540-$n$, the phase shift of the respective LO signal may be set based on a desired transmit direction for the phased antenna array. It is to be appreciated that each receive chain may include one or more additional components (not shown).

Figure 16:
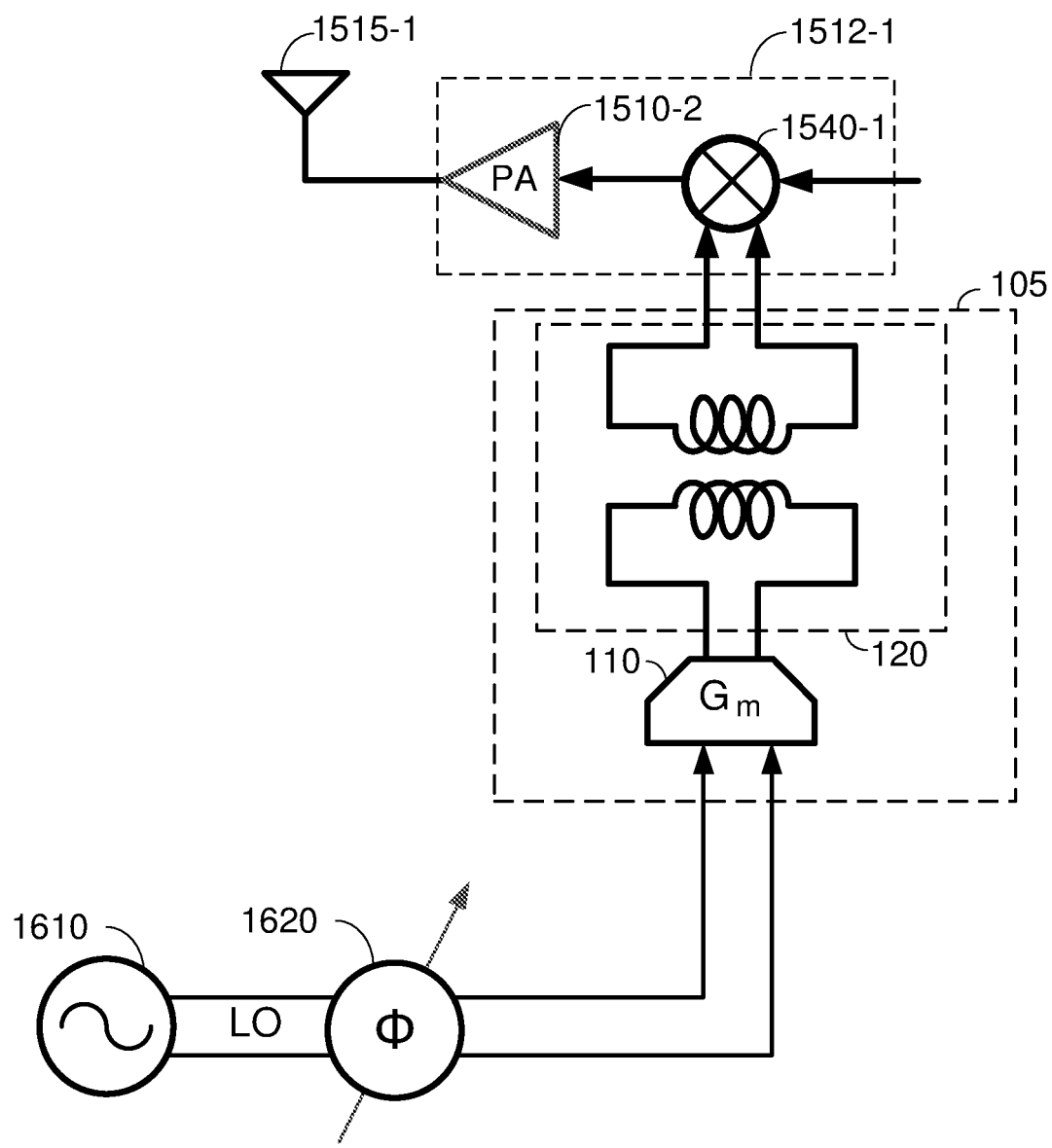
FIG. 16 shows an example of an LO network for providing an LO signal to a mixer in the transmitter shown in FIG. 15 according to certain aspects of the present disclosure.

FIG. 16 shows an example of an LO network for providing the LO signal to the mixer 1540-1 in transmit chain 1512-1. In this example, the LO network includes an LO 1610, a phase shifter 1620, and a buffer 105 coupled to the mixer 1540-1. The output voltage swing of the buffer 105 may be controlled using the exemplary feedback circuit 205 shown in FIG. 2 or the exemplary feedback circuit 805 shown in FIG. 8. In this example, the LO 1610 is coupled to the phase shifter 1620, and the phase shifter 1620 is coupled to the input of the buffer 105. In operation, the LO 1610 generates an LO signal, and the phase shifter 1620 shifts the phase of the LO signal based on a desired transmit direction for the phased antenna array. The buffer 105 receives the phase-shifted LO signal from the phase shifter 1620 and drives the mixer 1540-1 based on the phase-shifted LO signal. It is to be appreciated that the LO network may include one or more additional components (not shown) in the LO path between the LO 1610 and the mixer 1540-1.

It is to be appreciated that the LO signal for each of the other mixers 1540-2 to 1540-$n$ shown in FIG. 15 may be provided by a respective LO network similar to the one shown in FIG. 16. In one example, the LO networks may share a common LO 1610, in which each LO network shifts the LO signal from the LO 1610 by a respective phase shift based on the desired transmit direction for the phased antenna array.

Figure 17:
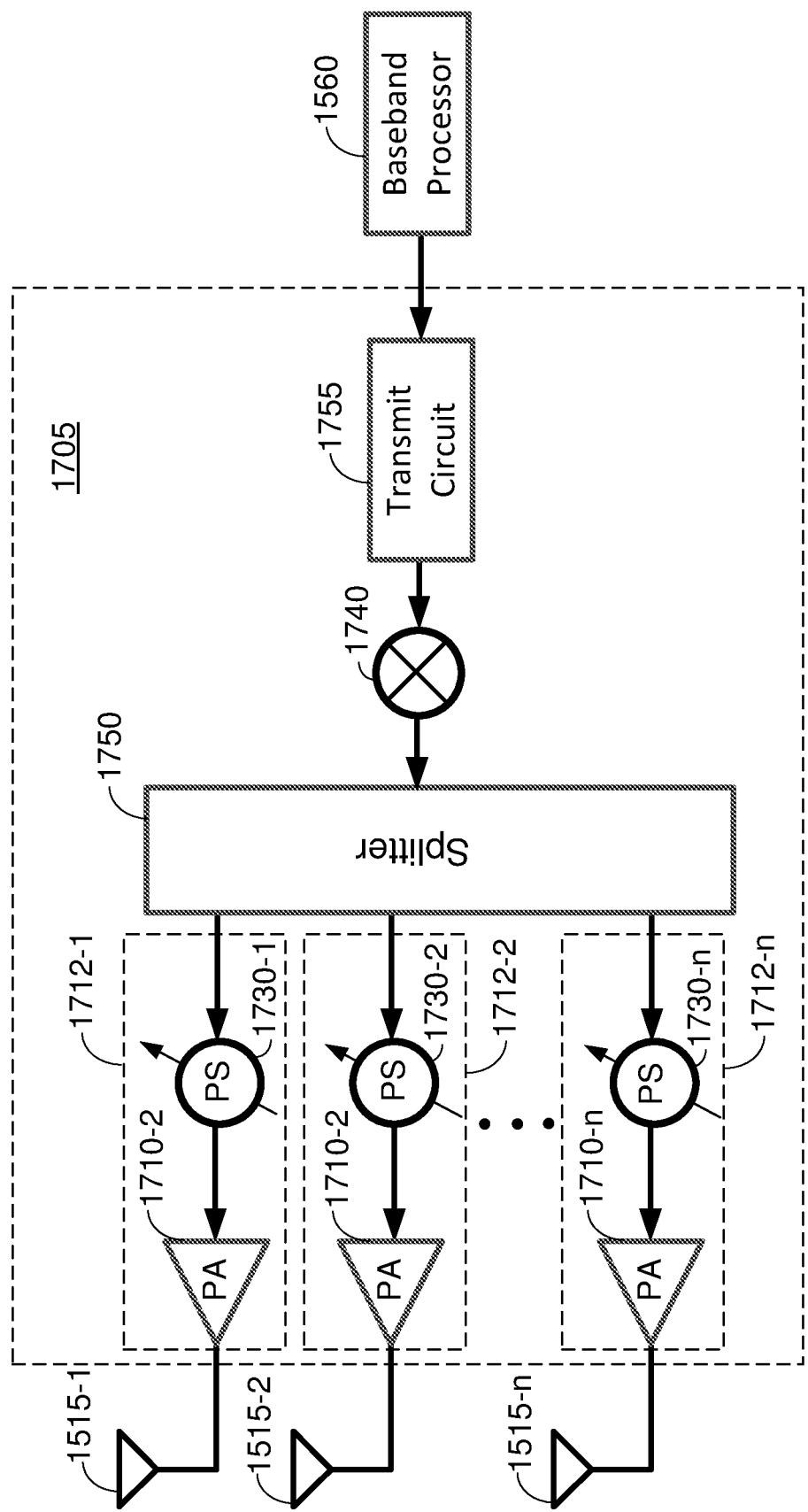
FIG. 17 shows another example of a transmitter for a phased antenna array according to certain aspects of the present disclosure.

FIG. 17 shows another example of a transmitter 1705 for a phased antenna array according to aspects of the present disclosure. In this example, frequency upconversion is performed before signal splitting, as discussed further below. The transmitter 1505 includes a transmit circuit 1755, a mixer 1740, a splitter 1750, and multiple transmit chains 1712-1 to 1712-$n$. Each of the transmit chains 1712-1 to 1712-$n$ has an input coupled to the splitter 1750 and an output coupled to a respective one of the antennas 1515-1 to 1515-$n$ in the phased antenna array.

In operation, a baseband processor 1560 outputs a signal to the transmit circuit 1755. The transmit circuit 1755 processes the received signal for transmission. Processing performed by the transmit circuit 1755 may include digital-to-analog conversion, amplification, etc. The transmit circuit 1755 outputs the processed signal to the mixer 1740, which mixes the processed signal with an LO signal to upconvert the frequency of the processed signal. The mixer 1740 outputs the frequency upconverted signal to the splitter 1750. The splitter 1750 splits the signal from the mixer 1740 into multiple signals, and inputs each of the multiple signals to a respective one of the transmit chains 1712-1 to 1712-$n$.

Each of the transmit chains 1712-1 to 1712-$n$ includes a respective phase shifter 1730-1 to 1730-$n$ and a respective power amplifier (PA) 1710-1 to 1710-$n$. In each transmit chain 1712-1 to 1712-$n$, the respective phase shifter 1730-1 to 1730-$n$ shifts the phase of the respective signal from the splitter 1750 by a respective phase shift, and the respective PA 1710-1 to 1710-$n$ amplifies the signal from the respective phase shifter. The phase shift for each phase shifter 1730-1 to 1730-$n$ may be set based on a desired transmit direction for the phased antenna array. The output signal of each transmit chain 1712-1 to 1712-$n$ is fed to the respective antenna 1515-1 to 1515-$n$ in the phased antenna array.

Figure 18:
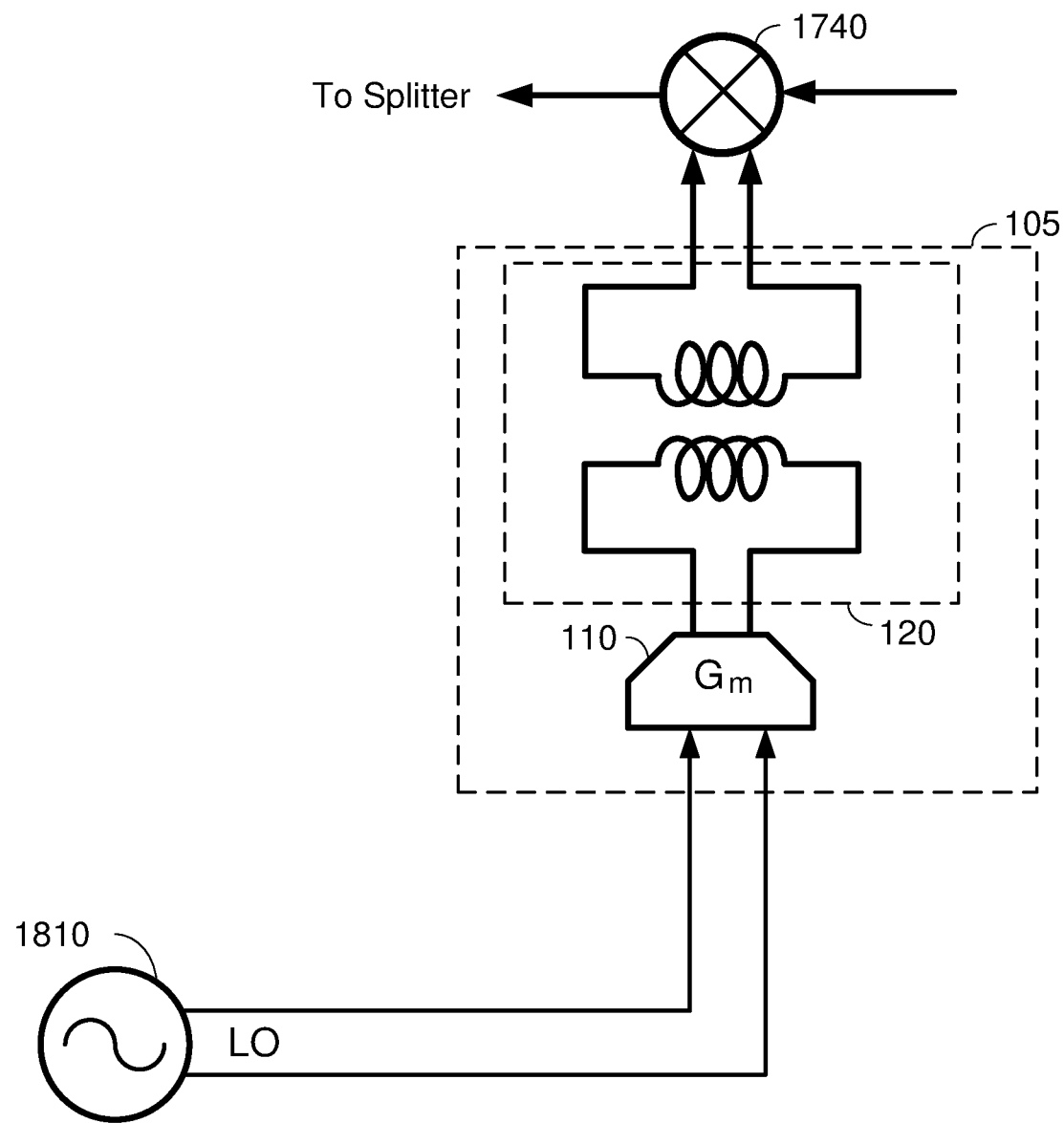
FIG. 18 shows an example of an LO network for providing an LO signal to a mixer in the transmitter shown in FIG. 17 according to certain aspects of the present disclosure.

FIG. 18 shows an example of an LO network for providing the LO signal to the mixer 1740 in the transmitter 1705. In this example, the LO network includes an LO 1810, and a buffer 105 coupled to the mixer 1740. The output voltage swing of the buffer 105 may be controlled using the exemplary feedback circuit 205 shown in FIG. 2 or the exemplary feedback circuit 805 shown in FIG. 8. In this example, the LO 1810 is coupled to the input of the buffer 105. In operation, the LO 1810 generates an LO signal, which is input to the input of the buffer 105. The buffer 105 receives the LO signal and drives the mixer 1740 based on the LO signal. It is to be appreciated that the LO network may include one or more additional components (not shown) in the LO path between the LO 1810 and the mixer 1740.

The control circuits 220 and 820 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, two values (e.g., voltages) are "approximately" equal if one of the values is within 90 percent to 110 percent of the other value. As used herein, controlling the regulated voltage 235 is understood to mean controlling the voltage level of the regulated voltage 235.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus for buffering an input signal, comprising:
   a transformer including an input inductor and an output inductor, wherein the input inductor is magnetically coupled to the output inductor;
   a transconductance driver configured to drive the input inductor based on the input signal;
   a mixer coupled to the output inductor; and
   a feedback circuit configured to:
      detect an output voltage swing at the output inductor;
      generate a regulated voltage at the input inductor; and
      control the regulated voltage based on the detected output voltage swing.

2. The apparatus of claim 1, wherein the input signal comprises a differential input voltage, and the transconductance driver is configured to convert the differential input voltage into a current to drive the input inductor.

3. The apparatus of claim 2, wherein the transconductance driver comprises:
   a first transistor having a drain coupled to a first end of the input inductor, a gate coupled to a first input of the transconductance driver, and a source coupled to a ground; and
   a second transistor having a drain coupled to a second end of the input inductor, a gate coupled to a second input of the transconductance driver, and a source coupled to the ground.

4. The apparatus of claim 3, wherein the transconductance driver further comprises a bias circuit configured to bias the gate of the first transistor and the gate of the second transistor with a gate bias voltage.

5. The apparatus of claim 1, wherein the feedback circuit is configured to:
   compare the detected output voltage swing with a target voltage swing; and
   adjust the regulated voltage based on the comparison.

6. The apparatus of claim 5, wherein the feedback circuit is configured to adjust the regulated voltage in a direction that reduces a difference between the output voltage swing and the target voltage swing.

7. The apparatus of claim 6, wherein the feedback circuit is configured to:
   decrease the regulated voltage if the detected output voltage swing is above the target voltage swing; and
   increase the regulated voltage if the detected output voltage swing is below the target voltage swing.

8. The apparatus of claim 1, wherein the feedback circuit comprises:
   a peak detector coupled to the output inductor, wherein the peak detector is configured to detect the output voltage swing at the output inductor, and generate a swing detection signal based on the detected output voltage swing;
   a voltage regulator coupled to the input inductor, wherein the voltage regulator is configured to generate the regulated voltage; and
   a control circuit coupled to the peak detector and the voltage regulator, wherein the control circuit is configured to control the regulated voltage generated by the voltage regulator based on the swing detection signal.

9. The apparatus of claim 8, wherein the control circuit is configured to:
   compare the swing detection signal with a target reference signal corresponding to a target voltage swing; and
   adjust the regulated voltage based on the comparison.

10. The apparatus of claim 9, wherein the control circuit is configured to adjust the regulated voltage in a direction that reduces a difference between the swing detection signal and the target reference signal.

11. The apparatus of claim 9, wherein the control circuit comprises:
    a replica circuit configured to generate the target reference signal; and
    an operational amplifier having a first input, a second input, and an output, wherein the swing detection signal is input to the first input, the target reference signal is input to the second input, the output is configured to output a control signal to the voltage regulator, and the control signal controls the regulated voltage.

12. The apparatus of claim 11, wherein the replica circuit is a replica of the peak detector.

13. The apparatus of claim 11, wherein:
    the peak detector comprises:
       a first transistor having a gate coupled to a first output of the output inductor, a drain coupled to a supply rail, and a source coupled to a first node, wherein the first node is coupled to the first input of the operational amplifier;
       a second transistor having a gate coupled to a second output of the output inductor, a drain coupled to the supply rail, and a source coupled to the first node; and
       a first current source coupled between the first node and a ground; and
    the replica circuit comprises:
       a third transistor having a gate coupled to a bias circuit, a drain coupled to the supply rail, and a source coupled to a second node, wherein the second node is coupled to the second input of the operational amplifier;
       a fourth transistor having a gate coupled to the bias circuit, a drain coupled to the supply rail, and a source coupled to the second node; and
       a second current source coupled between the second node and the ground.

14. The apparatus of claim 11, wherein the swing detection signal comprises a sense voltage related to the output voltage swing, and the target reference signal comprises a reference voltage.

15. The apparatus of claim 14, wherein the operational amplifier is configured to adjust the control signal in a direction that reduces a difference between the sense voltage and the reference voltage.

16. The apparatus of claim 14, wherein the sense voltage is approximately proportional to the output voltage swing.

17. The apparatus of claim 11, wherein the voltage regulator comprises a transistor coupled between a supply rail and a center tap of the input inductor, and the control signal is input to a gate of the transistor.

18. The apparatus of claim 1, wherein the regulated voltage is applied to a center tap of the input inductor.

19. An apparatus for buffering an input signal, comprising:
- a transformer including an input inductor and an output inductor, wherein the input inductor is magnetically coupled to the output inductor;
- a transconductance driver configured to drive the input inductor based on the input signal;
- a mixer coupled to the output inductor; and
- a feedback circuit configured to:
  - detect an output voltage swing at the output inductor; and
  - control a bias current of the transconductance driver based on the detected output voltage swing.

20. The apparatus of claim 19, wherein the feedback circuit is configured to:
- compare the detected output voltage swing with a target voltage swing; and
- adjust the bias current based on the comparison.

21. The apparatus of claim 20, wherein the feedback circuit is configured to:
- adjust the bias current in a direction that reduces a difference between the output voltage swing and the target voltage swing.

22. The apparatus of claim 19, wherein the input signal comprises a differential input voltage, and the transconductance driver is configured to convert the differential input voltage into a current to drive the input inductor.

23. The apparatus of claim 22, wherein the transconductance driver comprises:
- a first transistor having a gate and a drain;
- a second transistor having a gate and a drain, wherein the input inductor is coupled between the drains of the first and second transistors, and the differential input voltage is input to the gates of the first and second transistors;
- a current source configured to generate an adjustable current; and
- a current-mirror transistor having a drain coupled to the current source, and a gate coupled to the gates of the first and second transistors, wherein the feedback circuit controls the bias current of the driver by controlling the adjustable current of the current source.

24. The apparatus of claim 23, wherein the current source comprises a current-source transistor, and the feedback circuit is configured to control the adjustable current by controlling a gate voltage of the current-source transistor.

25. An apparatus for buffering an input signal, comprising:
- a transformer including an input inductor and an output inductor, wherein the input inductor is magnetically coupled to the output inductor;
- a mixer coupled to the output inductor;
- means for driving the input inductor based on the input signal;
- means for detecting an output voltage swing at the output inductor;
- means for generating a regulated voltage at the input inductor; and
- means for controlling the regulated voltage based on the detected output voltage swing.

26. An apparatus for buffering an input signal, comprising:
- a transformer including an input inductor and an output inductor, wherein the input inductor is magnetically coupled to the output inductor;
- a transconductance driver configured to drive the input inductor based on the input signal; and
- a feedback circuit comprising a:
  - a swing detection circuit coupled to the output inductor and configured to generate a voltage swing signal indicative of an amount of output voltage swing at the output inductor;
  - a voltage regulator circuit different from the transconductance driver, the voltage regulator circuit coupled to the input inductor, the voltage regulator circuit configured to generate a regulated voltage at the input inductor; and
  - a control circuit configured to receive the voltage swing signal, the control circuit coupled to the voltage regulator circuit and configured to control the regulated voltage generated by the voltage regulator circuit based on the voltage swing signal.

27. The apparatus of claim 26, wherein the swing detection circuit comprises a peak detector.

28. The apparatus of claim 26, wherein the output inductor is coupled to a mixer.

29. The apparatus of claim 26, wherein the control circuit comprises:
- a replica circuit including a replica of at least a portion of the swing detection circuit, the replica circuit configured to generate a target reference signal; and
- an operational amplifier having a first input, a second input, and an output, wherein the voltage swing signal is input to the first input, the target reference signal is input to the second input, and the output is configured to output a control signal to the voltage regulator circuit.

* * * * *